(12) United States Patent
Lee

(10) Patent No.: US 8,995,211 B2
(45) Date of Patent: Mar. 31, 2015

(54) PROGRAM CONDITION DEPENDENT BIT LINE CHARGE RATE

(75) Inventor: Shih-Chung Lee, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 419 days.

(21) Appl. No.: 13/453,725

(22) Filed: Apr. 23, 2012

(65) Prior Publication Data

US 2013/0279258 A1    Oct. 24, 2013

(51) Int. Cl.
  *G11C 7/00*   (2006.01)
  *G11C 11/56*  (2006.01)
  *G11C 16/06*  (2006.01)
  *G11C 16/04*  (2006.01)
  *G11C 16/30*  (2006.01)

(52) U.S. Cl.
  CPC ............ *G11C 11/5628* (2013.01); *G11C 16/06* (2013.01); *G11C 16/0483* (2013.01); *G11C 16/30* (2013.01)
  USPC ................. 365/195; 365/185.17; 365/185.25; 365/189.011; 365/203

(58) Field of Classification Search
  USPC .................. 365/185.17, 185.25, 185.02, 195, 365/189.011, 203
  See application file for complete search history.

(56) References Cited

U.S. PATENT DOCUMENTS

| | | | |
|---|---|---|---|
| 6,522,583 B2 * | 2/2003 | Kanda et al. ............. | 365/185.17 |
| 6,639,842 B1 | 10/2003 | Hoang et al. | |
| 7,046,568 B2 | 5/2006 | Cernea | |
| 7,643,347 B2 | 1/2010 | Abiko et al. | |
| 7,692,987 B2 | 4/2010 | Edahiro et al. | |
| 7,957,185 B2 | 6/2011 | Li et al. | |
| 8,427,881 B2 * | 4/2013 | Jang et al. ................ | 365/185.25 |
| 2010/0271871 A1 * | 10/2010 | Yamada ..................... | 365/185.2 |
| 2011/0176367 A1 | 7/2011 | Edahiro | |

OTHER PUBLICATIONS

"A 151mm2 64Gb MLC NAND Flash Memory in 24nm CMOS Technology," 2011 IEEE International Solid-State Circuits Conference, Session 11, Non-Volatile Memory Solutions 11.1, Feb. 22, 2011, pp. 198-199, 2 pages.

* cited by examiner

*Primary Examiner* — Toan Le
(74) *Attorney, Agent, or Firm* — Vierra Magen Marcus LLP

(57) ABSTRACT

Methods and devices for charging unselected bit lines are disclosed. The rate at which inhibited (or unselected) bit lines are charged may depend on a program condition. The program condition may be completion of a program loop. As another example, the program condition may be a certain program state completing or nearly completing programming. As one example, the bit lines may be charged at a faster rate prior to the program condition occurring than after the program condition. As another example, the bit lines may be charged at a slower rate prior to the program condition than after the program condition. Charging the unselected bit lines at a slower rate may reduce current consumption. Charging the unselected bit lines at a faster rate may allow for faster programming.

32 Claims, 16 Drawing Sheets

PROGRAM CONDITION DEPENDENT BIT LINE CHARGE RATE

BACKGROUND

The present disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the drain and source diffusion regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its drain and source is controlled by the level of charge on the floating gate.

Groups of memory cells may be associated with a bit line. In one approach, memory cells are arranged as NAND strings, with each NAND string being associated with one bit line. A selected memory cell in the group may be sensed by applying a voltage to the selected memory cell and sensing a signal on the bit line. During programming, different voltages can be applied to the bit line to control the rate at which the selected memory cell programs.

Typically, a program voltage $V_{PGM}$ applied to the control gate during a program operation is applied as a series of pulses that increase in magnitude as programming progresses. In one possible approach, the magnitude of the pulses is increased with each successive pulse by a predetermined step size, e.g., 0.2-0.4 V. $V_{PGM}$ can be applied to the control gates of flash memory cells. In the periods between the program pulses, verify operations are carried out. That is, the programming level of each element of a group of cells being programmed in parallel is read between successive programming pulses to determine whether it is equal to or greater than a verify level to which the element is being programmed.

After a given memory cell on the word line selected for programming reaches its intended threshold voltage, programming may be inhibited for that memory cell. In one approach, programming is inhibited by applying an inhibit voltage to bit lines associated with NAND strings without a memory cell presently being programmed. In one approach, programming is allowed by grounding bit lines associated with NAND strings having a memory cell presently being programmed. In one approach, some memory cells undergo slow programming by applying an intermediate voltage to bit lines associated with their NAND strings.

Charging up the bit lines associated with inhibited NAND strings can result in a very large current. It is possible for the current to be so large that it causes the voltage of a power supply to drop. Therefore, performance of the memory device may be impaired.

One possible solution is to limit the rate at which the bit lines are charged, and then use a monitoring circuit that detects the speed at which the bit lines are charging up. The program pulse can be applied when the bit lines are fully charged. In effect, the time between starting to charge the bit lines and applying the program pulse is dynamically adjusted. When the bit lines present a heavy load and charging is slow, the program pulse needs to be applied later. However, when the bit lines present a lighter load and charging is faster, the program pulse may be applied sooner. Therefore, programming speed is increased. However, this approach requires special circuitry, which incurs a chip size penalty. Also, this circuitry must be tested to ensure that it works properly, which adds to the cost of developing the memory device.

DETAILED DESCRIPTION

The present disclosure provides methods and devices for operating non-volatile storage. In some embodiments, the rate at which inhibited (or unselected) bit lines are charged depends on a program condition. In one embodiment, the program condition is the number of program loops that have completed. In one embodiment, the program condition is completion (or nearly completion) of programming a certain program state. In one embodiment, the bit lines are charged at a faster rate prior to the program condition occurring than after the program condition. In one embodiment, the bit lines are charged at a slower rate prior to the program condition than after the program condition.

In one embodiment, the rate at which inhibited bit lines are charged depends on which program loop is being performed. During the earlier program loops, the inhibited bit lines may be charged at a slower rate, which may reduce peak current consumption. During later program loops, the inhibited bit lines may be charged at a faster rate, which speeds up programming. On the other hand, the inhibited bit lines may be charged at a faster rate early in programming and a slower rate later in programming.

In one embodiment, the rate at which inhibited bit lines are charged depends on whether a certain program state has completed or has nearly completed programming. Prior to completion (or near completion) of programming that state, the inhibited bit lines may be charged at a slower rate, which may reduce peak current consumption. After completion (or near completion) of programming that state, the inhibited bit lines may be charged at a faster rate, which speeds up programming. On the other hand, the inhibited bit lines may be charged at a faster rate prior to completion of programming the state and a slower rate after completing programming the state.

Figure 1A:
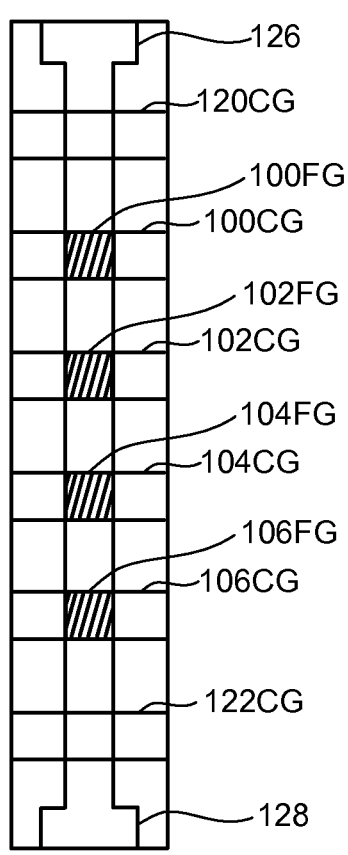
FIG. 1A is a top view of a NAND string.
Figure 1B:
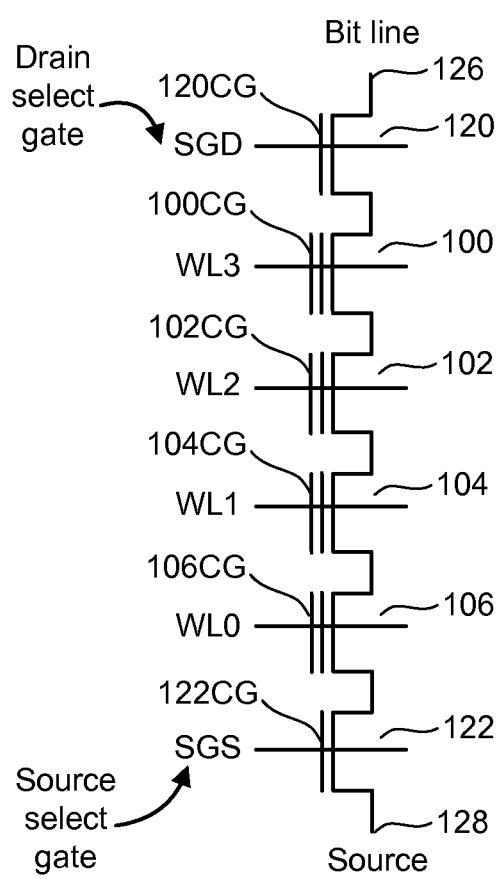
FIG. 1B is an equivalent circuit diagram of the NAND string of FIG. 1A.

One example of a memory system suitable for implementing embodiments uses a NAND flash memory structure, which includes arranging multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1A and 1B. Select gate 120 is connected to select line SGD. Select gate 122 is connected to select line SGS. In one embodiment, select gates 120 and 122 are each implemented with a "select transistor." Thus, select gate 120 may be referred to as a "drain side select transistor," (or SGD transistor) and select gate 122 may be referred to as a "source side select transistor" (or SGS transistor).

Figure 2:
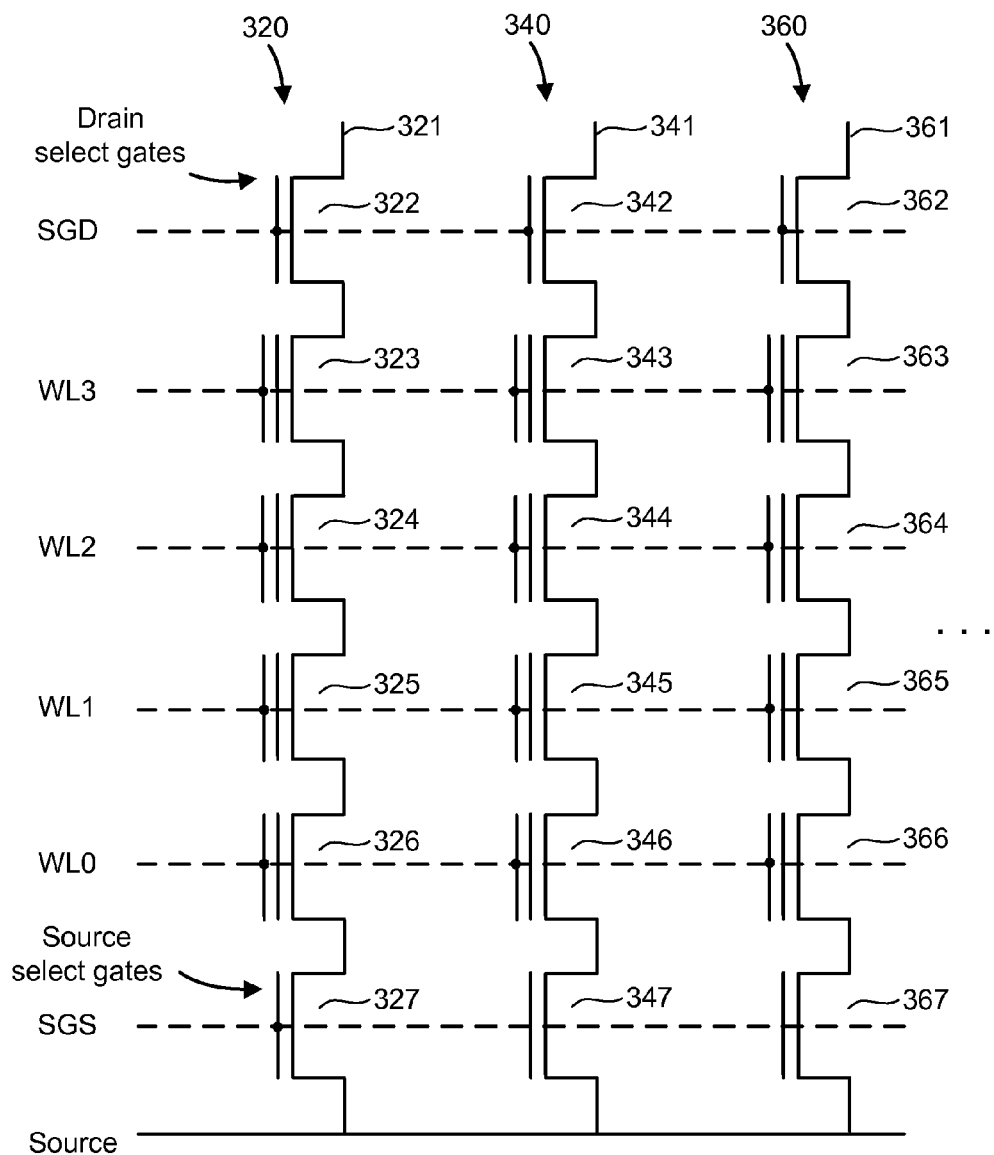
FIG. 2 is a circuit diagram depicting three NAND strings.

FIG. 2 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have thirty-two, sixty-four, or more storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. In one embodiment, the various NAND strings 320, 340 and 360 are connected to respective bit lines 321, 341 and 361, by select transistors. In one embodiment, the select transistors are in the select gates 322, 342, 362, etc. In one embodiment, the select transistors form the select gates 322, 342, 362. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422; 5,570,315; 5,774,397; 6,046,935; 6,456,528; and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 3:
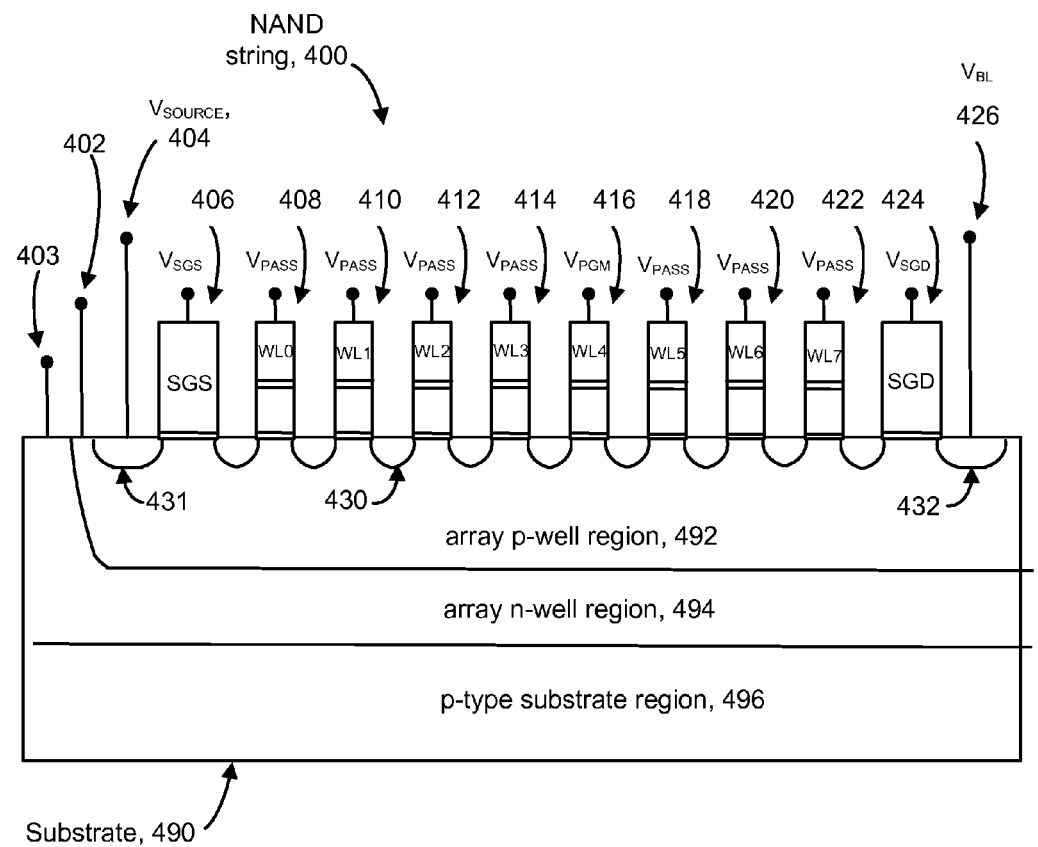
FIG. 3 depicts a cross-sectional view of a NAND string formed on a substrate.

FIG. 3 depicts a cross-sectional view of a NAND string formed on a substrate. The view is simplified and not to scale. The NAND string 400 includes a source-side select gate (or SGS transistor) 406, a drain-side select gate (or SGD transistor) 424, and eight storage elements 408, 410, 412, 414, 416, 418, 420 and 422, formed on a substrate 490. A number of source/drain regions, one example of which is source drain/region 430, are provided on either side of each storage element. In one embodiment, the substrate 490 employs a triple-well technology which includes an array p-well region 492 within an array n-well region 494, which in turn is within a p-type substrate region 496. The NAND string and its non-volatile storage elements can be formed, at least in part, on the array p-well region 492.

A voltage $V_{SOURCE}$ is provided to a source line contact 404. The source line contact has an electrical connection to the diffusion region 431 of SGS transistor 406. A bit line voltage $V_{BL}$ is supplied to bit line contact 426, which is in electrical contact with the diffusion region 432 of SGD transistor 424. Voltages, such as body bias voltages, can also be applied to the array p-well region 492 via a terminal 402 and/or to the array n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively.

Figure 4:
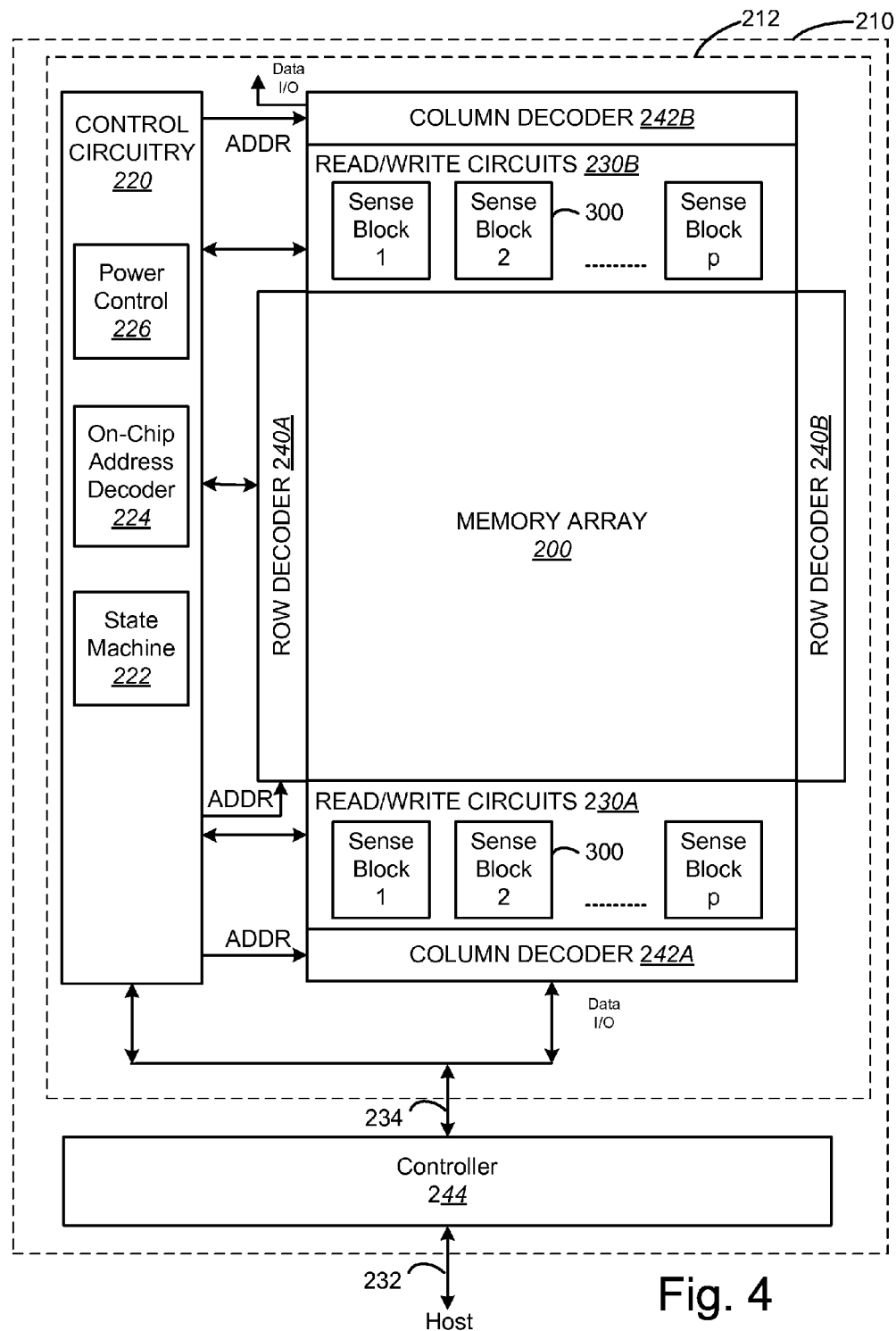
FIG. 4 illustrates a non-volatile storage device.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5A:
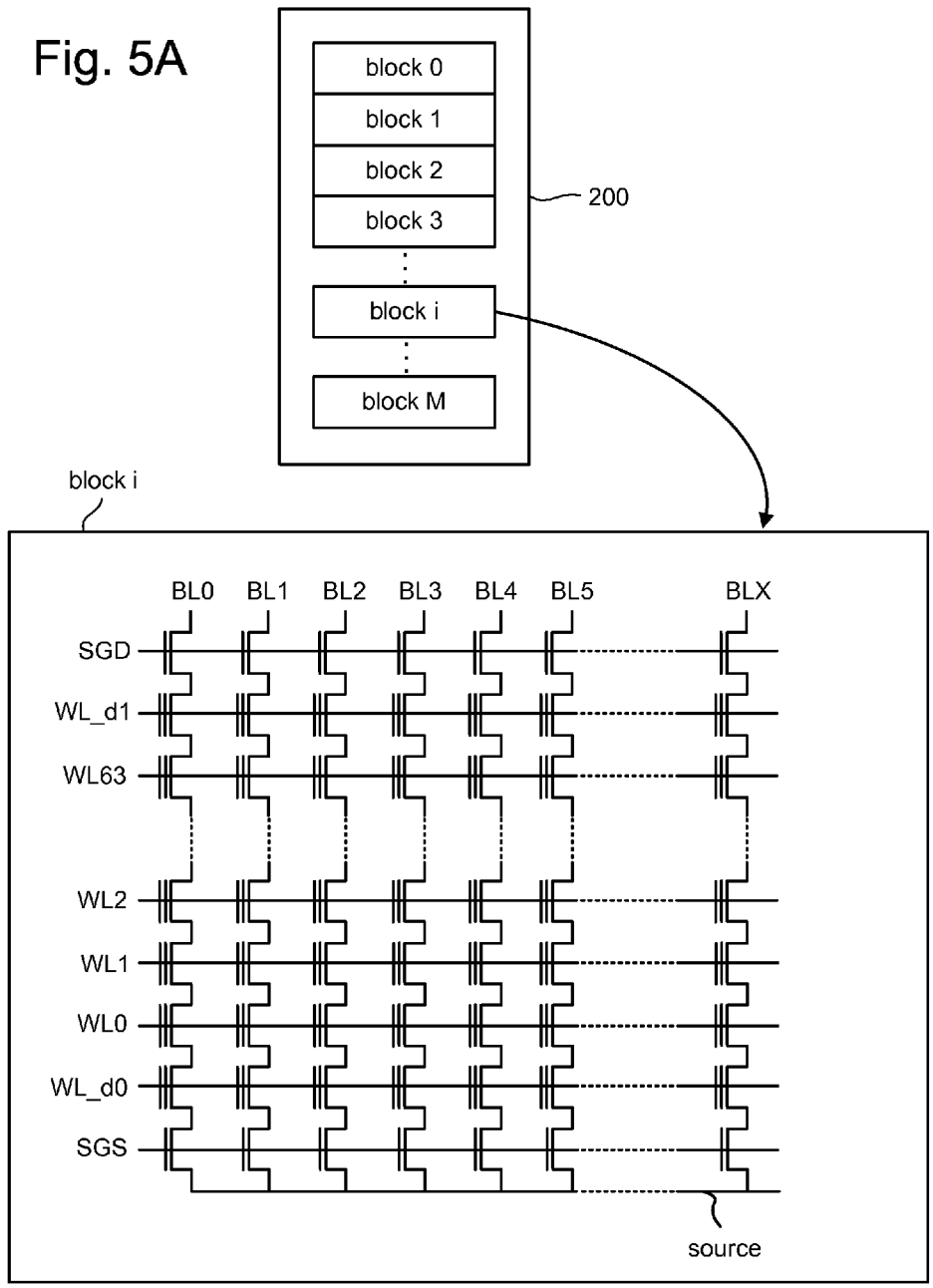
FIG. 5A depicts an exemplary structure of memory cell array.

FIG. 5A depicts an example structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5A shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5B:
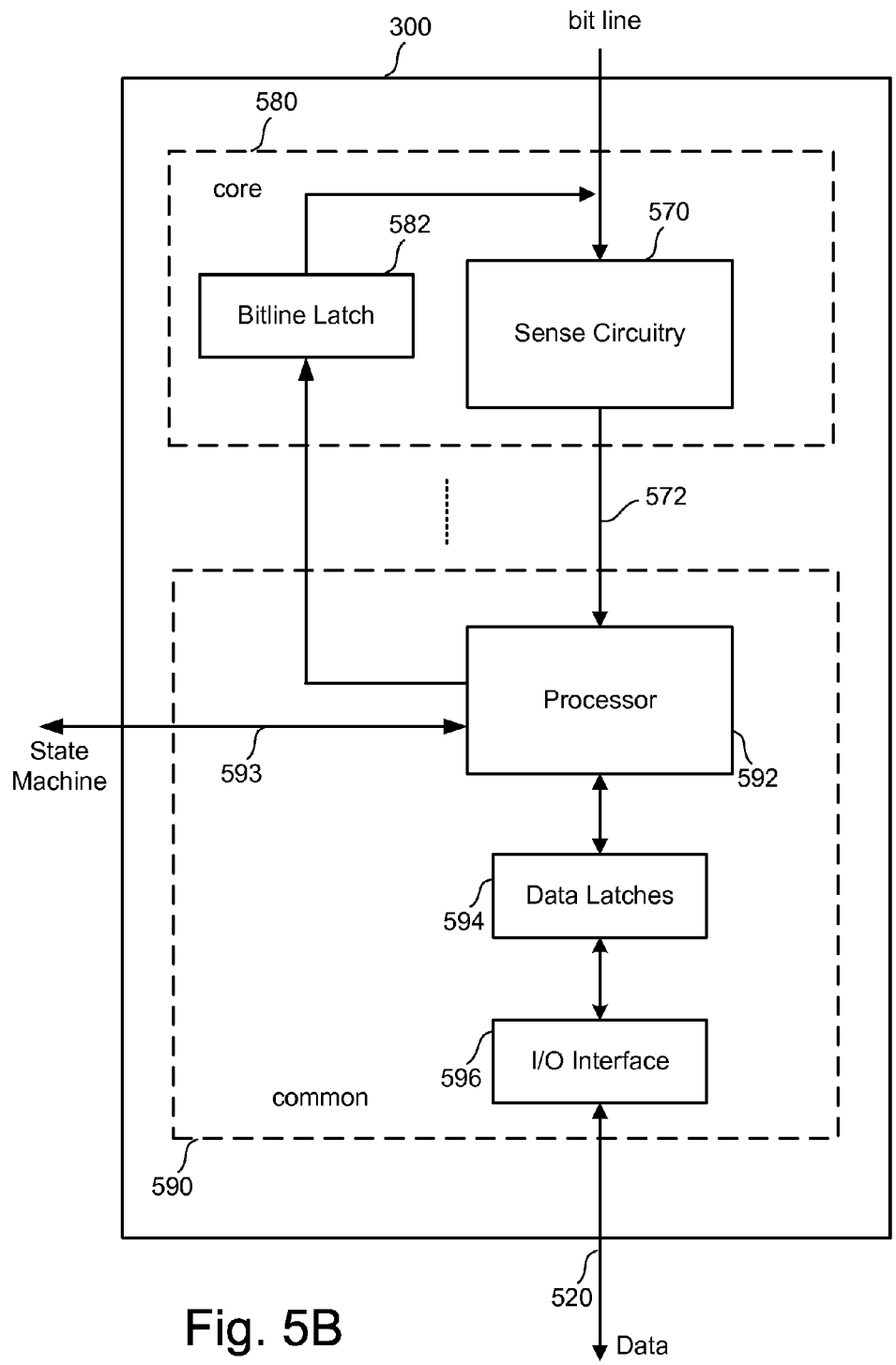
FIG. 5B is a block diagram of an individual sense block.

FIG. 5B is a block diagram of an individual sense block 300 partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572. For further details, refer to U.S. Patent Application Publication 2006/0140007, which is incorporated herein by reference in its entirety.

Sense module 580 comprises sense circuitry 570 that determines whether a conduction current in a connected bit line is above or below a predetermined threshold level. In some embodiments, sense module 580 includes a circuit commonly referred to as a sense amplifier. Sense module 580 also includes a bit line latch 582 that is used to set a voltage condition on the connected bit line. For example, a predetermined state latched in bit line latch 582 will result in the connected bit line being pulled to a state designating program inhibit (e.g., $V_{DD}$).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed memory cell and store the determined data in the set of data latches. The set of data latches 594 is used to store data bits determined by processor 592 during a read operation. Data latches 594 may also be used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 222 that controls the supply of different control gate voltages to the addressed cell. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

It is anticipated that some implementations will include multiple processors 592. In one embodiment, each processor 592 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 592 to accumulate the results of the associated bit lines such that the state machine need only read the wired-OR line one time.

During program or verify, the data to be programmed is stored in the set of data latches 594 from the data bus 520. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 592 monitors the verified memory state relative to the desired memory state. When the two are in agreement, processor 592 sets the bit line latch 582 so as to cause the bit line to be pulled to a state designating program inhibit. This inhibits the cell coupled to the bit line from further programming even if it is subjected to programming pulses on its control gate. In other embodiments the processor initially loads the bit line latch 582 and the sense circuitry sets it to an inhibit value during the verify process. In one embodiment, the magnitude of the inhibit value depends on the location of the selected word line.

Data latch stack 594 contains a stack of data latches corresponding to the sense module. In one embodiment, there are 3-5 (or another number) data latches per sense module 580. In one embodiment, the latches are each one bit. In some implementations (but not required), the data latches are implemented as a shift register so that the parallel data stored therein is converted to serial data for data bus 520, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568, "Memory Sensing Circuit and Method for Low Voltage Operation; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

Figure 6A:
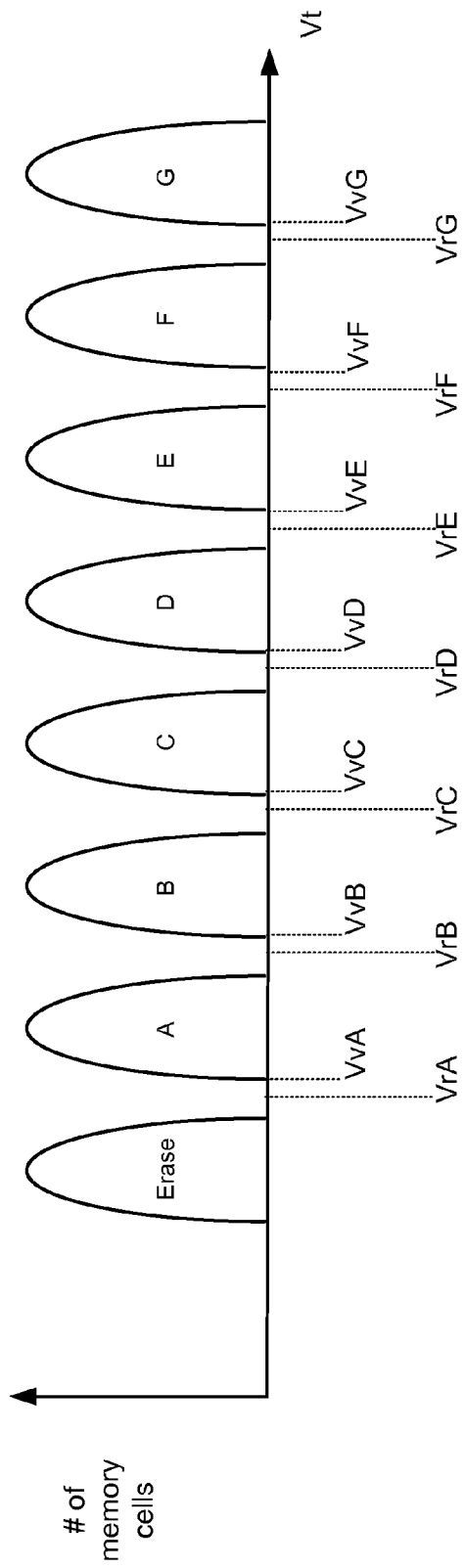
FIG. 6A depicts an example set of Vt distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive.

However, the threshold voltages in one or more of programmed states A-G may be negative. Thus, in one embodiment, at least VrA is negative. Other voltages such as VvA, VrB, VvB, etc., may also be negative.

Between each of the data states are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

Figure 6B:
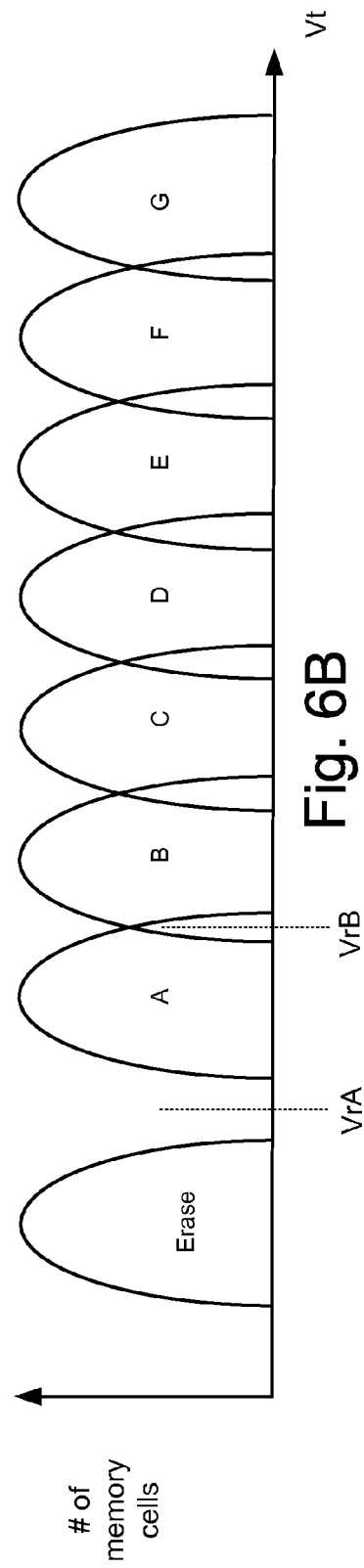
FIG. 6B depicts an example set of Vt distributions.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 7A:
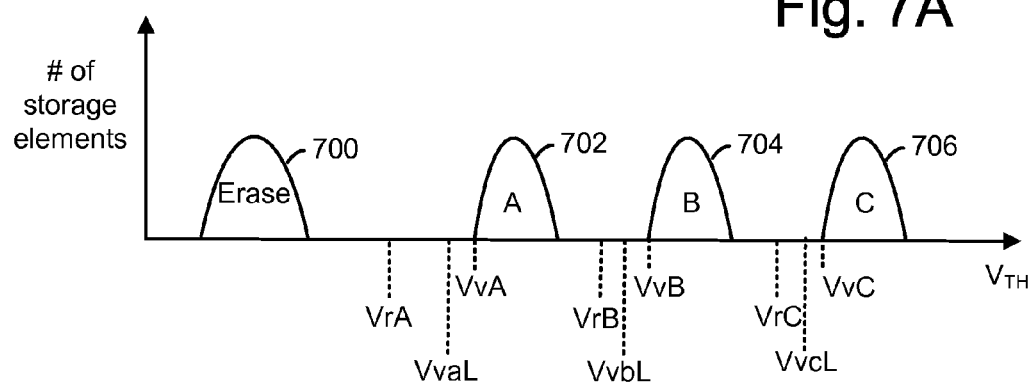
FIG. 7A depicts an example set of threshold voltage distributions for a four-state memory device in which each storage element stores two bits of data.

In some embodiments, a "verify low" and a "verify high" reference voltage is used. FIG. 7A depicts an example set of threshold voltage distributions for a four-state memory device in which each storage element stores two bits of data. A first threshold voltage distribution 700 is provided for erased (Erased-state) storage elements. Three threshold voltage distributions 702, 704 and 706 represent programmed states A, B and C, respectively. In one embodiment, the threshold voltages in the Erased-state are negative, and the threshold voltages in the A-, B- and C-states are positive.

Read reference voltages, VrA, VrB and VrC, are also provided for reading data from storage elements. By testing whether the threshold voltage of a given storage element is above or below VrA, VrB and VrC, the system can determine the state, e.g., the storage element is in.

Further, verify reference voltages, VvA, VvB, and VvC are provided. When programming storage elements to the A-state, B-state or C-state, the system will test whether those storage elements have a threshold voltage greater than or equal to VvA, VvB or VvC, respectively. In one embodiment, "verify low" reference voltages, VvaL, VvbL, and VvcL are provided. Similar "verify low" reference voltages could also be used in embodiments with a different number of states.

Figure 7B:
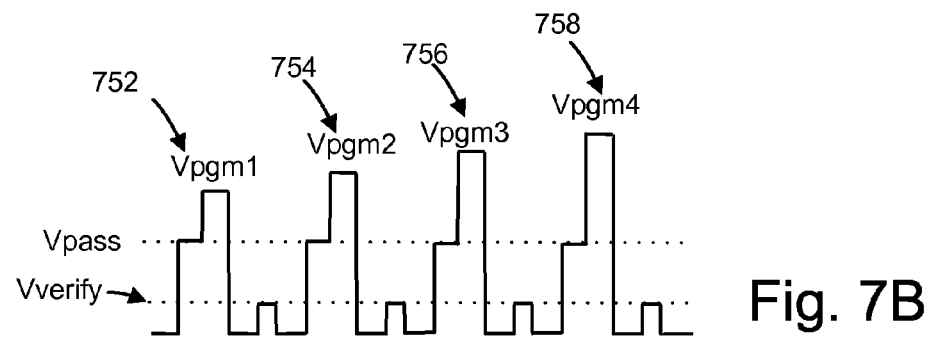
FIG. 7B shows a series of program pulses that may be used to program a distribution of FIG. 7A.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 7B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

In one embodiment, some of the memory cells are first programmed to an intermediate state. For example, memory cells targeted for the B- and C-states may be programmed to an intermediate state in a first programming pass. Then, in a second programming pass, memory cells targeted for the C-state are programmed from the intermediate state to the C-state and memory cells targeted for the A-state are programmed form the erased state to the A-state. Note that the first program pass could have multiple program loops. Program loops are further described with respect to FIGS. 11 and 13. Likewise, the second program pass could have multiple program loops Other techniques involving first programming to an intermediate state are possible. Further examples of programming sequences are discussed in U.S. Pat. No. 7,508, 715 to Lee, titled "Coarse/Fine Program Verification in Non-Volatile Memory Using Different Reference Levels for Improved Sensing," which is hereby incorporated by reference for all purposes.

In one embodiment, "foggy-fine" programming is used in which memory cells are first programmed to a threshold level below their final intended threshold level in a "coarse" or "foggy" program pass. These states may be referred to as foggy states. Subsequently, the memory cells are programmed the remainder way to their intended threshold voltages in a fine programming pass. The final programmed state may be referred to as fine programmed state. Note that the foggy program pass could have multiple program loops. Note that the fine program pass could have multiple program loops. Further details of foggy-fine programming are discussed in U.S. Pat. No. 8,130,552 to Miwa et al., titled "Multi-Pass Programming for Memory with Reduced Data Storage Requirement," which is hereby incorporated by reference for all purposes.

In one embodiment, first the B- and C-states are programmed, then the A-state is programmed. While the B- and C-states are being programmed, bit lines associated with memory cells to be programmed to the A-state are inhibited. Then, after programming of the B- and C-states is complete, bit lines associated with memory cells to be programmed to the A-state are selected.

One example of a slow programming mode uses low (offset) and high (target) verify levels for one or more data states. For example, VvaL and VvA are offset and target verify levels, respectively, for the A-state, and VvbL and VvB are offset and target verify levels, respectively, for the B-state. During programming, when the threshold voltage of a storage element which is being programmed to the A-state as a target state (e.g., an A-state storage element) exceeds VvaL, its programming speed is slowed, such as by raising the bit line voltage to a level, e.g., 0.6-0.8 V, which is between a nominal program or non-inhibit level, e.g., 0 V and a full inhibit level, e.g., 2-3 V. The middle value may be referred to as a quick pass write (QPW) value. This provides greater accuracy by avoiding large step increases in threshold voltage. In some embodiments, values for one or more of the nominal program value, QPW value, and/or the inhibit value depend on the location of the word line that is selected for programming.

When the threshold voltage reaches VvA, the storage element is locked out from further programming. Similarly, when the threshold voltage of a B-state storage element exceeds VvbL, its programming speed is slowed, and when the threshold voltage reaches VvB, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 7B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 752, 754, 756 and 758 have program voltages of Vpgm1, Vpgm2, Vpgm3 and Vpgm4, respectively, and so forth. A set of one or more verify voltages may be provided after each program pulse. In some embodiments, there may be two or more verify pulses between the program pulses. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 8A:
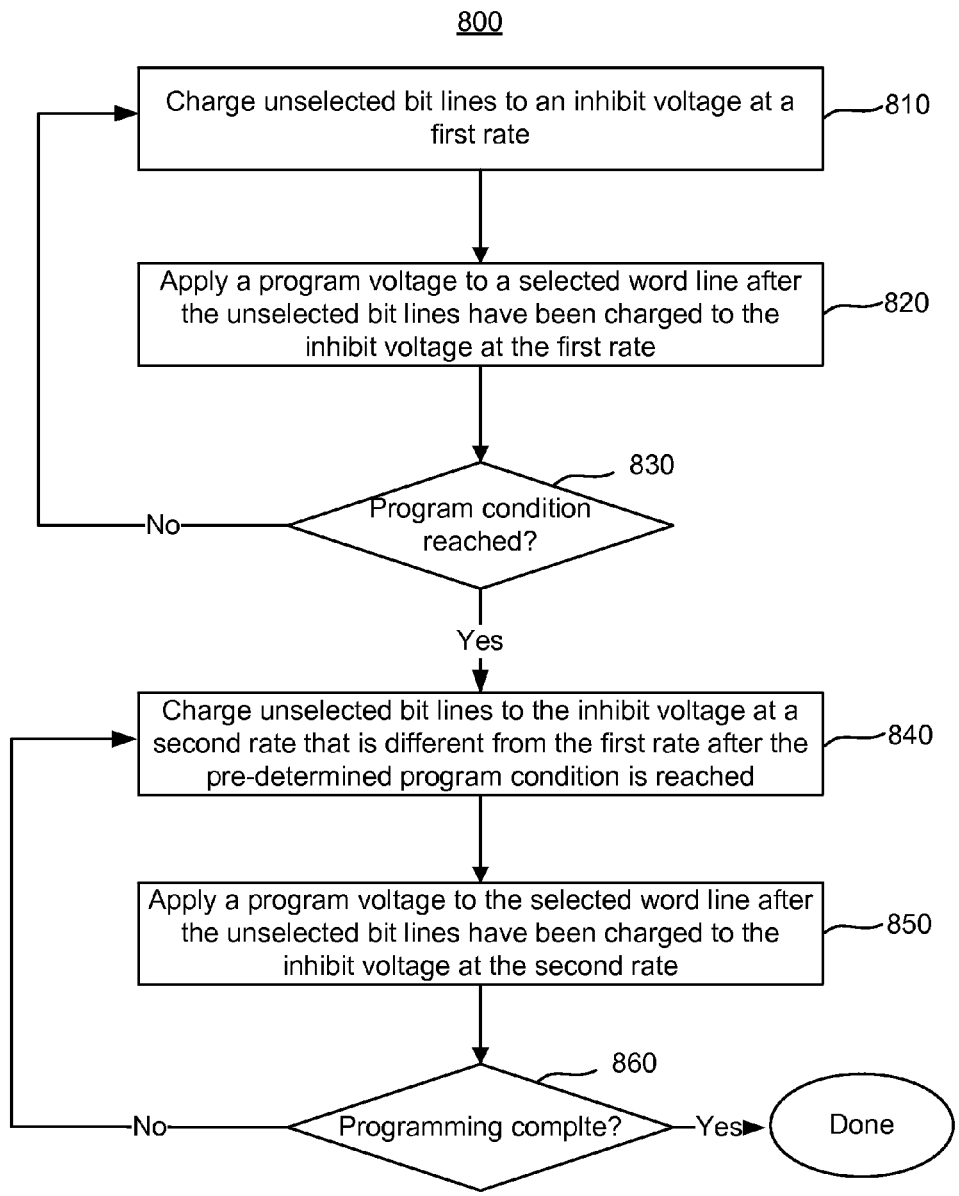
FIG. 8A is a flowchart describing one embodiment of a process of operating non-volatile storage.

FIG. 8A is a flowchart describing one embodiment of a process 800 of operating non-volatile storage. In one embodiment, one of the word lines is selected for programming during process 800. Thus, memory cells that are associated with the selected memory cell may undergo programming. In one embodiment, process 800 programs all bit lines. By this it is meant that a memory cell on each of the bit lines undergoes programming during process 800. Note that some of the memory cells undergoing programming will remain erased. In one embodiment, process 800 programs every other bit line. For example, either odd bit lines or even bit lines are programmed. Therefore, only half of the memory cells associated with the selected word line are programmed at a time in this odd/even bit line programming.

Process 800 describes charging unselected bit lines and applying programming voltages to a selected word line. An unselected bit line is one for which no memory cell is to receive programming at the present time. In other words, the program voltage that is applied to the selected word line should not program (e.g., is not intended to change the threshold voltage) the memory cells associated with unselected bit lines. The voltages applied to selected bit lines and unselected word lines are not described in process 800. However, examples of those voltages are discussed below.

In step 810, unselected bit lines are charged to an inhibit voltage at a first rate. The inhibit voltage may be a voltage having a magnitude that prevent the memory cells on that bit line from being programmed.

In step 820, a program voltage is applied to the selected word line after the unselected bit lines have been charged to the inhibit voltage.

In step 830, a determination is made whether a program condition has been reached. The program condition may be a pre-determined condition that indicates how far programming has progressed. In one embodiment, the program condition is some pre-determined number of program loops. In one embodiment, the program condition is whether programming memory cells to a certain state has been completed or nearly completed. For example, referring to FIG. 7A, a determination may be made whether all but some pre-determined number of memory cells that are targeted for the B-state 704 have reached the level VvB. The memory cells could alternatively be tested for the verify low level of VvbL. A different state could be used.

If the program condition has not yet been reached, then the process 800 returns to step 810. At some point the program condition is reached and the process 800 continues on to step 840. In step 840, the unselected bit lines are charged to an inhibit voltage at a second rate. In one embodiment, the second rate is faster than the first rate. In one embodiment, the second rate is slower than the first rate.

In step 840, a program voltage is applied to the selected word line after the unselected bit lines have been charged to the inhibit voltage at the second rate. If programming of the memory cells on the selected word line is complete, then process 800 ends. Otherwise, the process 800 returns to step 840 to charge the bit lines.

Figure 8B:
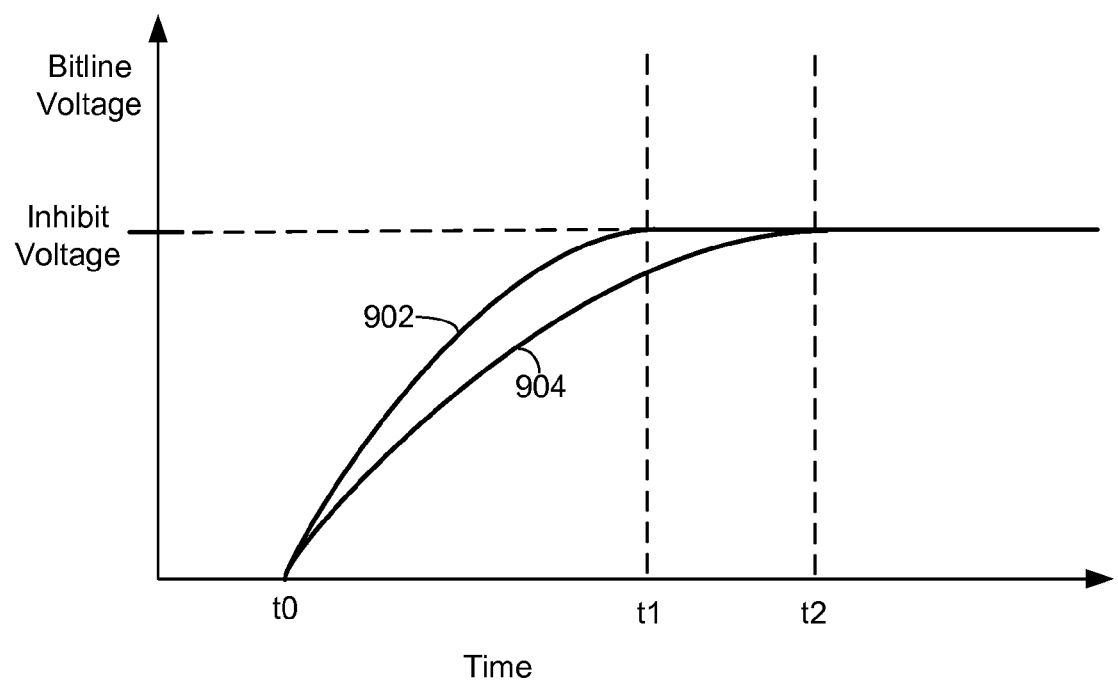
FIG. 8B is a diagram that illustrates different charge rates for unselected bit lines.

FIG. 8B is a diagram that illustrates different charge rates for unselected bit lines. Curve 902 shows a relatively fast charge rate, whereas curve 904 shows a slower charge rate. In each case, the charging begins at time t0. For curve 902, the bit line reaches the inhibit voltage at time t1. For curve 904, the bit line does not reach the inhibit voltage at until time t2. In one embodiment, more than two different bit line charge rates are used. The bit line charge rate may be deliberately controlled. In one embodiment, the bit line charge rate is controlled by controlling the rate at which an external supply voltage is allowed to charge the bit line. Further details are discussed below.

Figure 9:
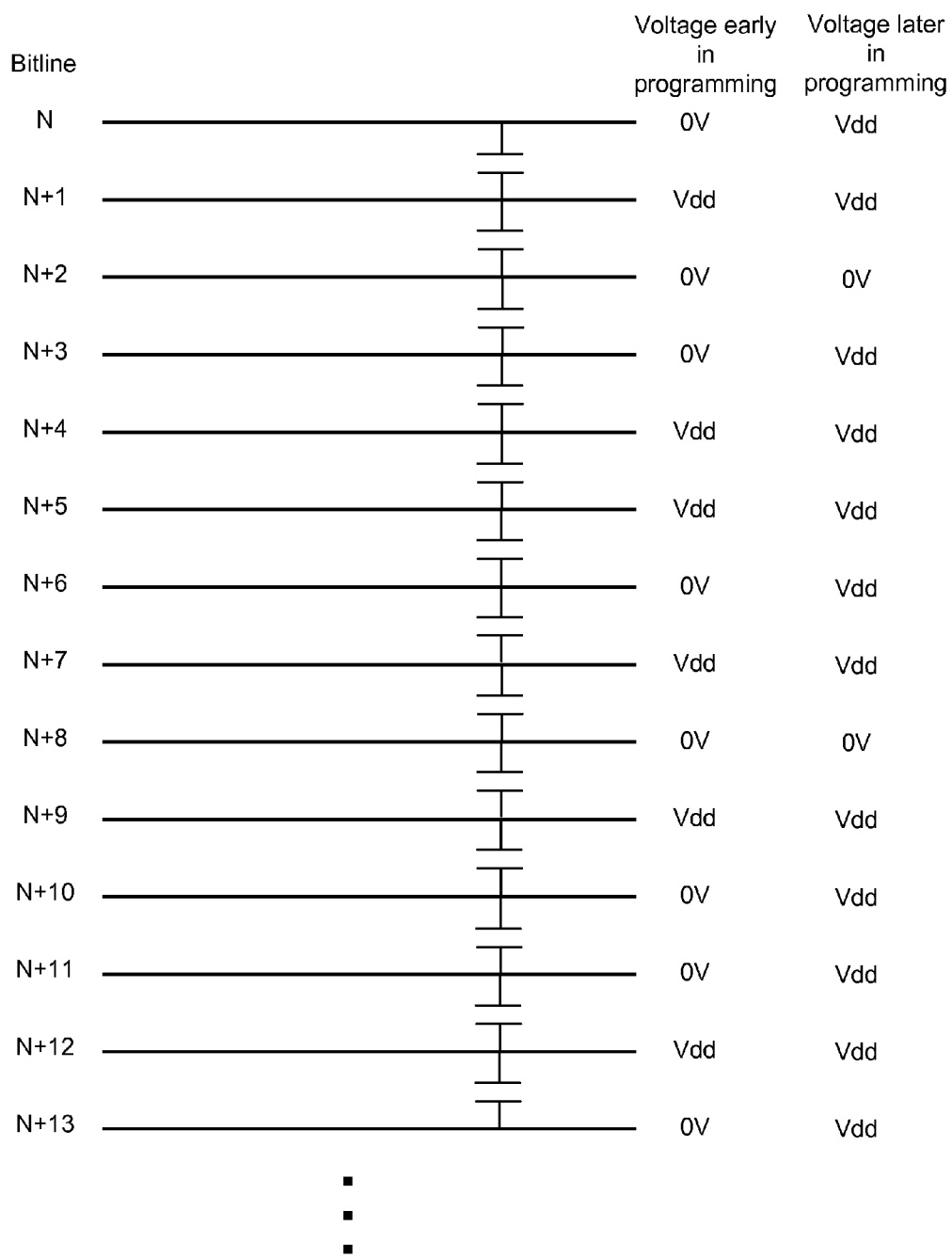
FIG. 9 is a diagram that shows one example of different voltages applied to bit lines early and late in programming.

FIG. 9 is a diagram that shows one example of different voltages applied to bit lines early and late in programming. These different voltages can impact the capacitive coupling between bit lines, which may affect current drawn when charging the bit lines. In one embodiment, bit lines that are selected for programming have 0V applied, whereas unselected bit lines have Vdd applied. Note that in some embodiments, some bit lines have an intermediate voltage applied thereto to slow the rate of programming. The example of FIG. 9 will not consider such intermediate voltages.

In one possible programming sequence, all memory cells to be programmed are initially in the erased state. Then, all memory cells that are targeted for another state (e.g., A, B, C) undergo programming with each program loop until a given memory cell reaches its intended target threshold voltage. When reaching its target threshold voltage, a memory cell may be locked out from further programming by charging its bit line to an inhibit voltage and maintaining the inhibit voltage while a program voltage is applied to the selected word line. Note that other programming sequences are possible. For example, cells targeted for the B- and C-states may initially be programmed to an intermediate (e.g., LM) state. In one embodiment, "foggy-fine" programming is used in which memory cells are first programming to "foggy" states, and subsequently programmed to "fine" states.

Throughout programming, memory cells that are to stay erased are charged to Vdd in one embodiment. In other words, they are always unselected. Also, some other memory cells could already be above their verify levels even at the beginning of a program pass. For example, if a first programming pass is used in which B- and C-state memory cells are programmed to an intermediate state, then B-state cells may already be above their verify level at the beginning of the second programming pass. Similar reasoning may apply to "foggy-fine" programming when the fine programming stage begins. Also, some memory cells may reach their intended state early in programming. Therefore, some of the other memory cells are charged to Vdd even early in programming. Later in programming, more memory cells have reached their intended state. Therefore, more bit lines will be charged to Vdd. The foregoing is represented in FIG. 9 by the two columns of voltages. For at least some embodiments, more and more cells are changed from selected to inhibited from early to later program loops.

Also note that there may be some capacitive coupling between neighboring bit lines (represented by capacitors in FIG. 9). When an unselected bit line is charged to Vdd, but its neighbor stays grounded, it is apparent that the coupling or loading between BLs is high. This implies that a substantial amount of charge (or current) is required in order to charge the unselected bit line. Whether an unselected bit line is neighbored on one or both sides by a selected bit line also impact the amount of charge (or current) needed to charge the unselected bit line. One possible way to view this is that when an unselected bit line is neighbored on one side by a selected bit line, then there is one coupling capacitor to be charged. However, when an unselected bit line is neighbored on both sides by a selected bit then, then there are two coupling capacitors to be charged. On the other hand, when an unselected bit line is between two other unselected bit lines, this may be viewed as not having to charge a coupling capacitor.

In the example of FIG. 9, early in programming two of the unselected bit lines are neighbored on both sides by selected bit lines (N+1 and N+13). Also, four of the unselected bit lines are neighbored on one side by a selected bit line. On the other hand, later in programming, none of the bit lines in this example are neighbored on both sides by a selected bit line. There are four unselected bit lines neighbored on one side by a selected bit line. However, it would be expected that more charge (or current) will be needed to charge the unselected bit lines early in programming in this example.

Note that it can be beneficial to reduce the peak current that is drawn. In one embodiment, the amount of current used to charge the bit lines early in programming is reduced, which may reduce peak current consumption. To prevent the high peak-current (of charging the coupling capacitors), the unselected bit lines are charged at a slower rate early in programming in one embodiment. This can be viewed as charging the capacitors illustrated in FIG. 9 more slowly. Later in programming, when more memory cells pass verify levels, more BLs become inhibited. Therefore, the number of coupling capacitors to be charged also reduces. In one embodiment, the rate of charging the unselected bit lines is faster later in programming. Charging the bit lines at a faster rate can help to speed up programming.

Note that in other situations it may be beneficial to charge the unselected bit lines faster earlier in programming and slower later in programming. In still other situations it may be beneficial to charge the unselected bit lines at three or more different rates, as programming progresses. One possible reason for such differences is the programming sequence.

Another possible programming sequence is to first program memory cells that are targeted for the B-state and C-state, with memory cells targeted for the A-state not being programmed. In this case, the bit lines associated with memory cells targeted for the A-state are unselected early in programming. After programming of the B-state and C-state is complete, memory cells targeted for the A-state are programmed. Thus, note that these "A-state bit lines" are unselected early in programming (while the B-state and C-state are programming), but then selected at the start of A-state programming, and then eventually again unselected as the A-state memory cells reach their intended state. Still other programming sequences are possible.

Also note that in some cases rather than programming all bit lines together, first the odd bit lines are programmed, then the even bit lines are programmed. Alternatively, even bit lines could be programmed prior to odd bit lines. This may impact when the peak current is drawn, and thus may impact when in the overall programming process to charge the bit lines slower to reduce current consumption, and when to charge the bit lines more quickly.

Furthermore, note that in some embodiments, a bit line has an intermediate voltage applied when its associated memory cell is nearly at its target threshold voltage. Thus, in addition to bit lines having, for example, Vdd and 0 V, there may be some that have an intermediate voltage. When an unselected bit line has a neighbor that is being charged to an intermediate voltage, the loading may not be as severe compared to a neighbor that is grounded. However, there may still be some loading in this case. This may be factored in when determining peak current being drawn to charge the bit lines. Also, a bit line being charged to the intermediate voltage may be impacted by a neighbor that stays grounded. However, in some embodiments, the intermediate voltage is only about ½ the inhibit voltage. Therefore, note that charging to the intermediate voltage may proceed at a slower rate than charging to the inhibit voltage, while still allowing the intermediate voltage to be reached as soon as or prior to the inhibit voltage being reached on unselected bit lines.

Figure 10A:
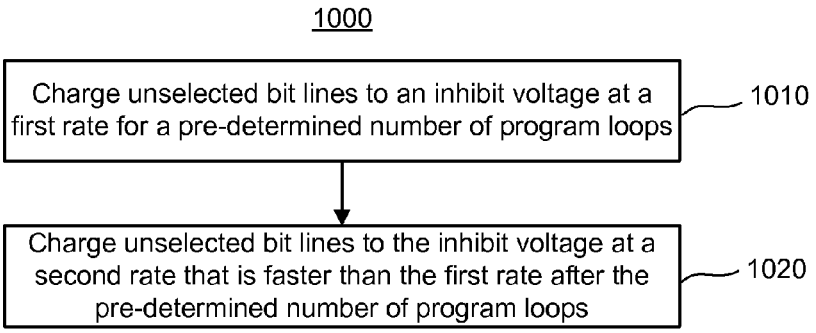
FIGS. 10A, 10B, 10C, and 10D are flowcharts of embodiments of programming non-volatile storage in which unselected bit lines are charged at a rate that depends on a program condition.
Figure 10B:
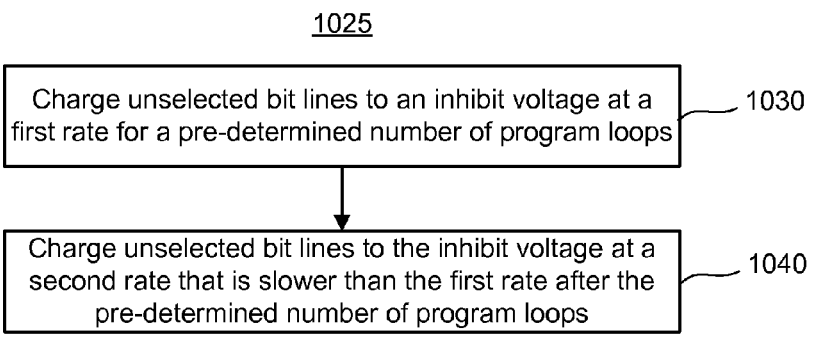
Figure 10C:
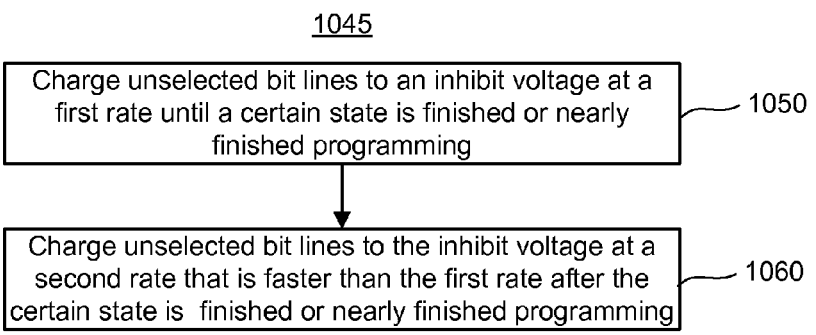
Figure 10D:
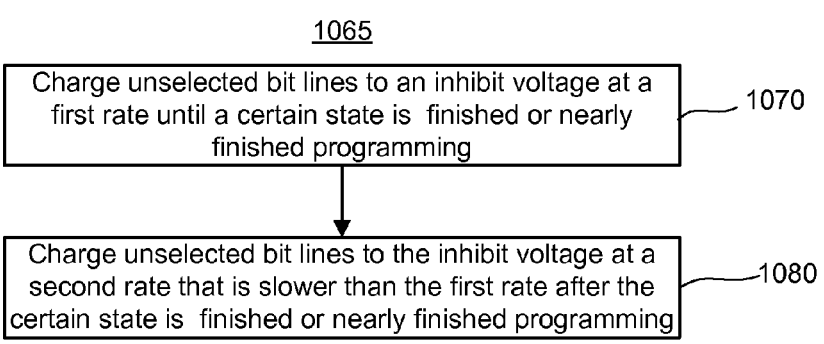

FIGS. 10A-10D are flowcharts of embodiments of programming non-volatile storage in which unselected bit lines are charged at a rate that depends on a program condition. In FIGS. 10A and 10B, the program condition is the number of program loops that have been completed. In FIGS. 10C and 10D, the program condition is whether a programming a certain program state is complete or nearly complete. Each of these flowcharts describes steps of charging unselected bit lines during a programming process. Signals that are applied to selected bit lines and word lines are not described in FIGS. 10A-10D.

FIG. 10A will be discussed first. In step 1010, unselected bit lines are charged to an inhibit voltage at a first rate for a pre-determined number of program loops. Step 1010 may pertain to the first "n" program loops, where "n" is 1 or more. Thus, note that step 1010 may include charging unselected bit lines more than once. Note that at some point after charging the first set of bit lines they may be discharged prior to the next charging. Also note that the bit lines that are unselected may be different with each charging, as memory cells complete their programming. As one possibility, more bit lines are unselected as programming progresses. However, note that in some programming sequences, some bit lines are inhibited early on, but then selected later. One such example, is that of programming the B- and C-states prior to programming the A-state. The bit lines may be charged at a rate such as indicated by curve 904 in FIG. 8B, as one example.

In step 1020, unselected bit lines are charged to the inhibit voltage at a second rate that is faster than the first rate. For example, the bit lines may be charged at a rate such as indicated by curve 902 in FIG. 8B. Step 1020 is performed after step 1010. For example, step 1020 applies for program loops "n+1" onward. Note that process 1000 could be modified to have additional steps that charge the unselected bit lines at a still different rate after some pre-determined number of program loops have completed. This rate could be faster or slower than the second rate. Also, the additional rate could be faster or slower than the first rate.

Process 1025 of FIG. 10B is similar to process 1000 of FIG. 10A, except that the second rate is less than the first rate. For example, during the earlier program loops a rate such as curve 902 is used. Then, during later program loops, a slower rate such as curve 904 is used. Note that process 1025 could be modified to have additional steps that charge the unselected bit lines at a still different rate after some pre-determined number of program loops have completed. This rate could be faster or slower than the second rate. Also, it could be faster or slower than the first rate.

Process 1045 of FIG. 10C will now be discussed. In step 1050, unselected bit lines are charged to an inhibit voltage at a first rate until a certain program condition occurs. As one example, the program condition is whether all but some pre-determined number of memory cells that are targeted for a certain state have reached their target threshold voltage. As a particular example, the program condition is whether all but "m" memory cells being programming to the B-state have reached the B verify level (e.g., VvB, FIG. 7A). Note that in some programming sequences, programming of a state is considered complete when all but some pre-determined number of memory cells have reached their verify level. As another example, the program condition is whether some pre-determined number of memory cells that are targeted for a certain state have reached their target threshold voltage. This number could be less than all of those that are targeted for the state. Step 1050 may be based on this number or a different (e.g., greater) number. Thus, note that step 1050 may include charging unselected bit lines more than once. For example, the bit lines may be charged at a rate such as indicated by curve 904 in FIG. 8B.

In step 1060, unselected bit lines are charged to the inhibit voltage at a second rate that is faster than the first rate. For example, the bit lines may be charged at a rate such as indicated by curve 902 in FIG. 8B. Step 1060 is performed after step 1050. For example, step 1060 applies after programming of memory cells to the B-state is complete.

Note that process 1045 could be modified to have additional steps that charge the unselected bit lines at a still different rate after some pre-determined number of program loops have completed. This rate could be faster or slower than the second rate. Also, it could be faster or slower than the first rate.

Process 1065 of FIG. 10D is similar to process 1045 of FIG. 10C, except that the second rate is less than the first rate. For example, prior to programming a certain state being complete (or nearly so) a rate such as curve 902 is used. Then, during later program loops, a slower rate such as curve 904 is used. Note that process 1065 could be modified to have additional steps that charge the unselected bit lines at a still different rate after another state completes (or nearly so). This rate could be faster or slower than the second rate. Also, it could be faster or slower than the first rate.

Note that process 1000, 1025, 1045, and 1065 may be used for a wide variety of programming sequences. For example, initially memory cells might be programmed to the A-, B-, and C-states. However, another sequence might be used, such as first programming memory cells to the B- and C-state. Then, after programming the B- and C-state, A-state programming is performed. Also, these processes, and others described herein, may be used when programming memory cells to eight states, 16 states, or some other number of states.

Figure 11:
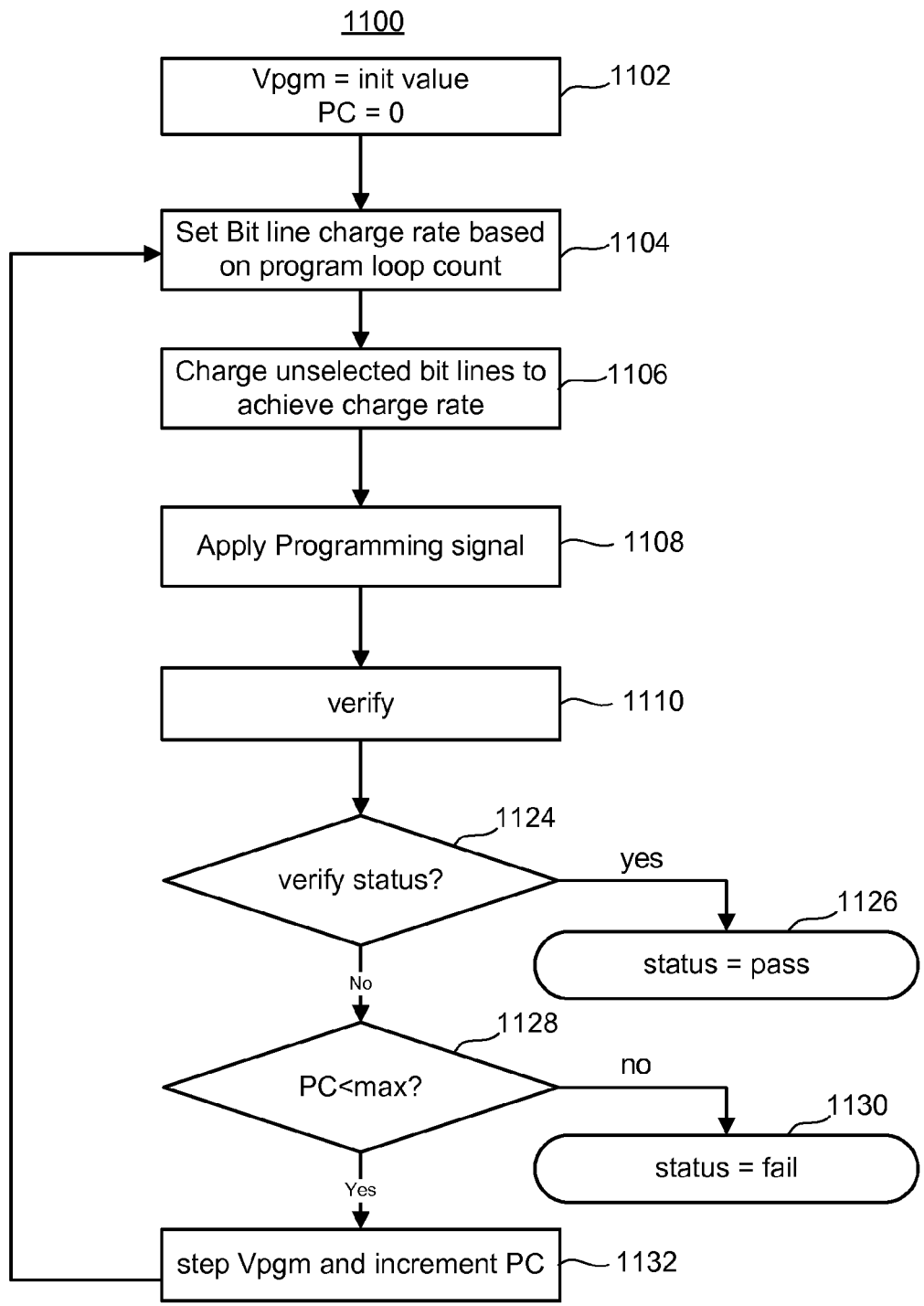
FIG. 11 is a flowchart illustrating one embodiment of a process of programming non-volatile storage in which the rate of charging unselected bit lines depends on the program loop count.

FIG. 11 is a flowchart illustrating one embodiment of a process 1100 of programming non-volatile storage in which the rate of charging unselected bit lines depends on the program loop count. In one embodiment, the process 1100 is used to program memory cells on a selected word line. In one embodiment, the process is used to program every memory cell on the selected word line. In one embodiment, the process is used to program every other memory cell (e.g., odd/even programming) on the selected word line.

Process 1100 will be discussed with reference to FIGS. 12(A)-12(H), which are timing diagrams illustrating voltages during program operations, according to one embodiment. The timing diagrams depict one embodiment of programming conditions that are applied during process 1100. The voltages shown are applied to various select lines, word lines, bit lines, and the common source line of the memory array, for NAND strings under fast programming, slow programming, and program inhibition. Note that FIG. 12(E) shows the voltage applied to the unselected bit lines. The program operation can be grouped into a Bit Lines Precharge Phase, a Program Phase and a Discharge Phase. Note that the Bit Lines Precharge Phase includes a phase (2a) in which the unselected bit lines are charged. The time length of phase (2a) may be variable, based on the unselected bit line charge rate. In other words, the time length of phase (2a) may be variable based on the program loop count.

In step 1102, the program voltage (Vpgm) is set to an initial value. Also, in step 1102, a program counter (PC) is initialized to zero.

In step 1104, a bit line charge rate is set based on the program lop count. In step 1106, unselected bit lines are charged at the bit line charge rate. FIG. 12(E) shows the unselected bit lines being charged during phase (2a).

The following describes further details of the Bit Lines Precharge & Boosting Phase during which unselected bit lines are charged. During phase (1), the SGS transistors 406 are turned off by SGS being at Vsgs (FIG. 12(A)) while the SGD transistors 424 are turned on by SGD going high to Vsg (FIG. 12(B)), thereby allowing a bit line to access a NAND string.

During phase (2a), the bit line voltage of a program-inhibited NAND string is allowed to rise to a predetermined voltage given by VBL_inhibit. When the bit line voltage of the program-inhibited NAND string rises to VBL_inhibit, the program-inhibited NAND string will float when the gate voltage on the SGD transistor 424 drops to V_SGD. At the same time, the bit line voltage of a programming NAND string is either pulled down to VBL_Select or maintained at VBL_Select if already there (FIG. 12(G)). In one embodiment, the voltage VBL_Select depends on which word line is selected for programming.

Also during phase (2a), the bit line voltage of NAND strings that are undergoing slow programming is set to an intermediate voltage given by VBL_QPW (FIG. 12(F)). The voltage VBL_QPW is between VBL_Select and VBL_inhibit. The voltage VBL_QPW allows the selected memory cell to program, but at a slower rate than if VBL_Select were used. In one embodiment, the voltage VBL_QPW depends on which word line is selected for programming.

Also during phase (2a), the voltage on the common source line is set to voltage given by V_Cell_Source (FIG. 12(H)).

During phase (3), the drain select line (SGD) connected to the SGD transistors 424 of NAND strings has its voltage lowered to V_SGD. In one embodiment, this will float only those program-inhibited NAND strings where their bit line voltage is comparable to V_SGD, since their SGD transistors 424 are turned off (FIGS. 12(B) & 12(E)). As for the NAND strings containing a memory cell to be programmed, their SGD transistors 424 will not be turned off relative to the bit line voltage (e.g., near 0V) at their drain.

In step 1108 of process 1100 a programming signal is applied to a selected word line. Referring to FIG. 12(D), the voltage Vpgm may be applied during the program phase. Note that unselected word lines may be raised to Vpass during phase 4 (see FIG. 12(C)). This pass voltage may help to prevent program disturb. Also, the selected word line may be raised to Vpass during phase 4, along with the unselected word lines. Finally, select line SGD may be lowered from Vsg to V_SGD during phase 3. Note that applying the inhibit voltage to the unselected bit lines, along with other voltages such as Vpass applied to the unselected word lines, may boost the channel voltage of NAND strings associated with unselected bit lines.

The following describes further details of setting up the word lines prior to the program phase, as well as the program phase. During phase (4), the memory cells in a NAND string not being programmed have their control gate voltage set to VPASS (FIG. 12(C)). Also, the memory cell being programmed may have its control gate voltage set to VPASS (FIG. 12(D)). Since a program-inhibited NAND string is floating, the VPASS applied to the control gates of the memory cells boosts up the voltages of their channels. For the sake of discussion, the entire NAND string may be considered to have a channel. Thus, it may be stated that VPASS boosts the channel voltage of the NAND string. VPASS may be set to some intermediate voltage (e.g., ~10V) relative to Vpgm (e.g., ~15-24V). Depending on the boosting scheme being used, the value of VPASS is not required to be the same for each unselected word line.

Program Phase: During phase (5), a programming voltage Vpgm is applied to the control gate of a memory cell selected for programming (FIG. 12(D)). This may be achieved by applying Vpgm to the selected word line. The memory cells under program inhibition (e.g., with boosted channels) will not be programmed. The memory cells under programming will be programmed.

Note that the length of time for phase (2a) may be variable and may depend on the program loop. This implies that the length of time from starting to charge the unselected bit lines (start of phase (2a)) to being to applying the program voltage to the selected word line (beginning of phase (5)) depends on the length of phase (2a). This means that when phase (2a) is shorter the overall time for a given program loop may be shorter. Thus, charging the unselected bit lines at a faster rate may have the benefit of shortening the program time. On the other hand, charging the unselected bit lines at a slower rate may decrease the current used, as discussed above.

Following the program stage, there may be a discharge phase. In the Discharge Phase (6), the various control lines and bit lines are allowed to discharge.

In step 1110, a verification process is performed. In one embodiment, the verification is a concurrent coarse/fine verify. Referring to FIG. 7A, as one example, some memory cells that are being programmed to the A-state are verified using the VvaL level, and others that are being programmed to the A-state are verified using the Vva level. During the initial programming steps in which the memory cell's threshold is well below the final level (Vva), course programming may be applied. However, after the memory cell's threshold voltage reaches VvaL, fine programming may be used. Thus, some memory cells are verified for coarse programming, whereas other memory cells are verified for fine programming. Note that when a particular memory cell has been verified as being programmed to its intended state, it may be locked out from further programming. Note that using coarse/fine programming is not required. In one embodiment, the intermediate verify levels (e.g., VvaL, VvbL, etc.) are not used.

Also note that during step 1110 the verification may be for more than one state. For example, memory cells being programmed to the A-, B-, and C-state could all undergo verify during step 1110. However, verification could be of less than all of the states (such as if the B- and C-states are programmed first).

In step 1124, it is determined whether all states have been successfully programmed. In one embodiment, a given state is successfully programmed if all but some number of the memory cells have reached the final target threshold voltage for that memory cell. The number may be zero or more. Thus, note that not every memory cell needs to reach its target threshold voltage.

If verification of all states passes, the programming process is completed successfully (status=pass) in step 1126. If all states are not verified as being programmed, then it is determined whether the program counter (PC) is less than a maximum value such as 20. If the program counter (PC) is not less than max (step 1128), then the program process has failed (step 1130). If the program counter (PC) is less than a maximum value (e.g., 20), then the program counter (PC) is incremented by one and the program voltage may be stepped up to the next pulse in step 1132. Subsequent to step 1132, the process loops back to step 1104.

For the iteration of step 1104, again the bit line charge rate is set based on the program loop count. It maybe that no change is needed. For example, the bit line charge rate may stay the same for several program loops. However, the bit line charge rate may be made faster or slower with this iteration. In one embodiment, a table is maintained that indicates an appropriate bit line charge rate for each loop count. Other techniques may be used.

In step 1106, the unselected bit lines are charged at the present bit line charge rate. Note that these unselected bit lines may be different from the previous iteration. One reason for this is that some memory cells may have been locked out from further programming due to reaching their intended threshold voltage. Another reason may be that a state that was not undergoing programming in the previous iteration is now undergoing programming. For example, during the verify step 1110, it may have been determined that the B- and C-states have completed programming. Therefore, the A-state may be programmed the next iteration.

Figure 12:
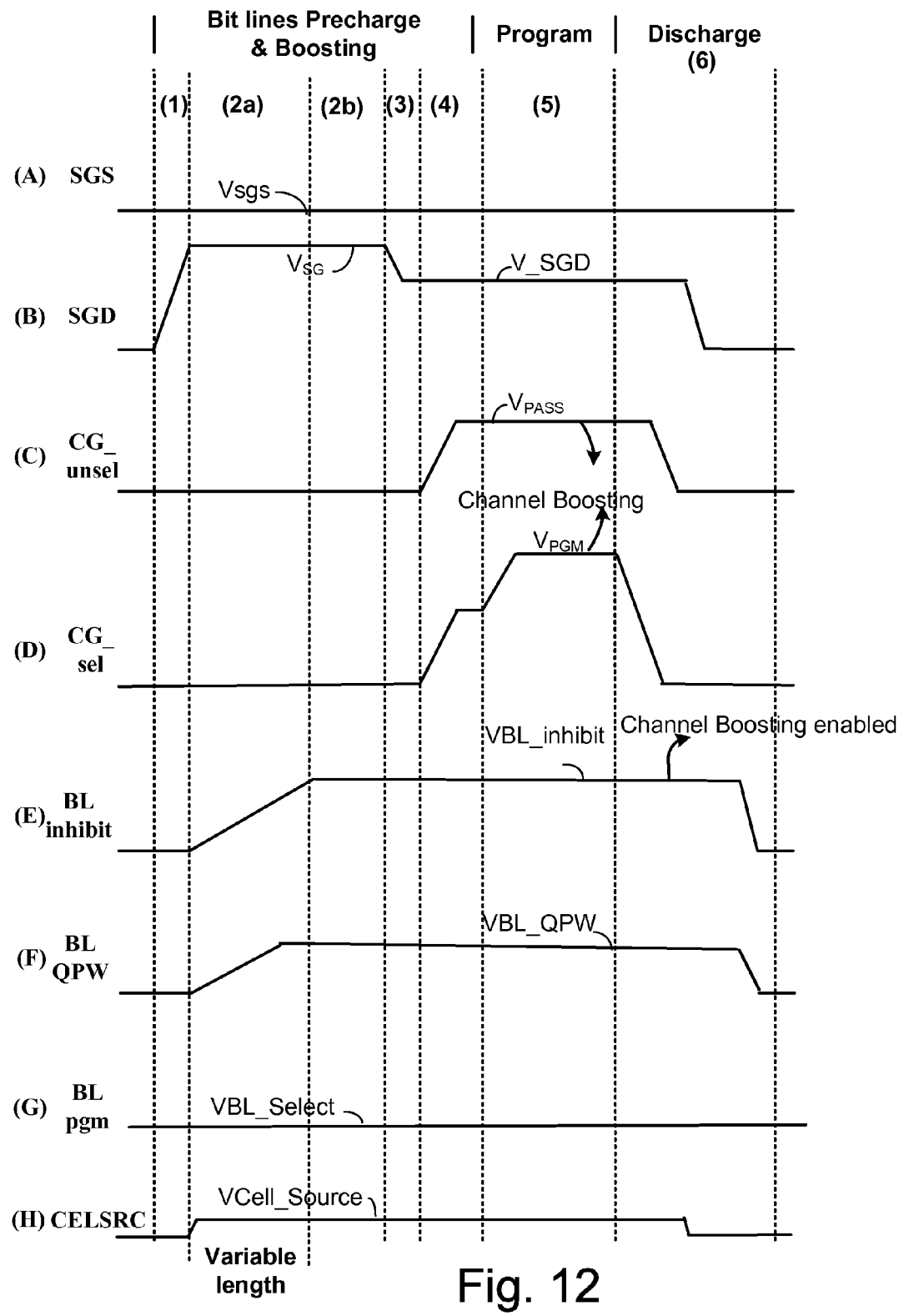
FIGS. 12(A)-12(H) are timing diagrams illustrating voltages during program operations, according to one embodiment.
Figure 13:
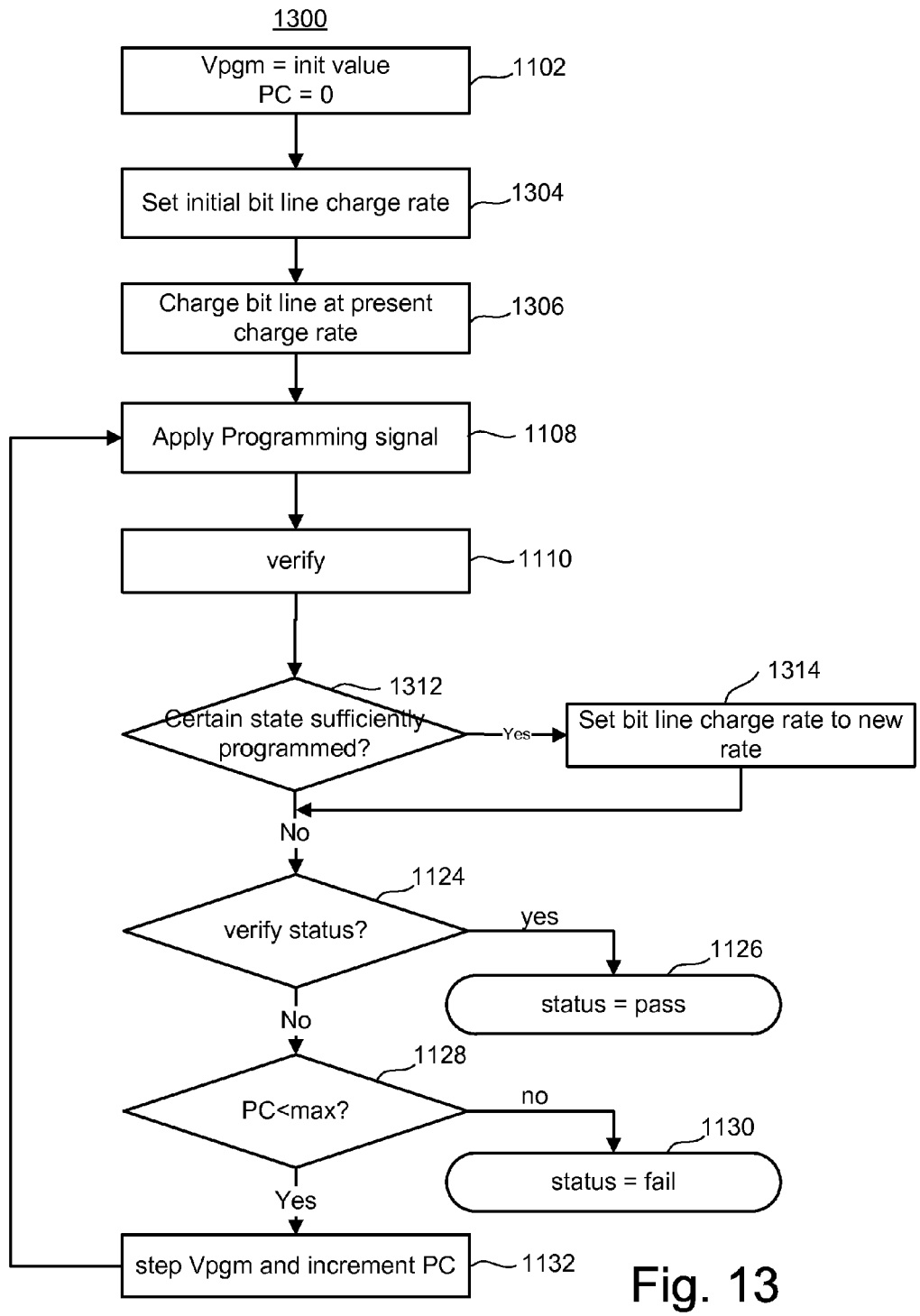
FIG. 13 is a flowchart illustrating one embodiment of a process of programming non-volatile storage in which the rate of charging unselected bit lines depends on whether a selected state is sufficiently programmed.

FIG. 13 is a flowchart illustrating one embodiment of a process 1300 of programming non-volatile storage in which the rate of charging unselected bit lines depends on whether a selected state is sufficiently programmed. In one embodiment, the process 1300 is used to program memory cells on a selected word line. In one embodiment, the process is used to program every memory cell on the selected word line. In one embodiment, the process is used to program every other memory cell (e.g., odd/even programming) on the selected word line. Note that the timing diagrams in FIGS. 12(A)-12(H) may be used in various embodiments of process 1300.

Since some steps of process 1300 are similar to those of process 1100, the same reference numerals from process 1100 will be used again in process 1300. Steps in process 1300 that are similar to like numbered steps in process 1100 will not be discussed in detail. In step 1102, the program voltage (Vpgm) is set to an initial value. Also, in step 1102, a program counter (PC) is initialized to zero.

In step 1304, an initial bit line charge rate is set. In step 1306, unselected bit lines are charged at the bit line charge rate. FIG. 12(E) shows the unselected bit lines being charged during phase (2a). Other signals depicted in FIG. 12 may also be applied, similar to that described previously in the discussion of FIG. 11.

In step 1108 of process 1300 a programming signal is applied to a selected word line. Referring to FIG. 12(D), the voltage Vpgm may be applied during the program phase. Other signals depicted in FIG. 12 may also be applied, similar to that described previously in the discussion of FIG. 11. In step 1110 of process 1300, a verification process is performed.

In step 1312, a determination is made whether a certain state is sufficiently programmed. This is one embodiment of determining whether a program condition has been met. As one example, a determination is made whether all but "n" memory cells being programmed to the B-state have reached their target threshold voltage. In one embodiment, this is also a test to determine whether programming of the B-state is complete. However, note that the test of step 1312 does not need to be the same as for whether the state is completely done programming. For example, the test for completing program could be whether 32 or fewer memory cells have not reached their target threshold voltage. The test of step 1312 might be whether 64 or fewer memory cells have not reached their target threshold voltage. As another example, the test of step 1312 may be based on whether "n" or fewer memory cells have yet to reach the verify low level (e.g., Vvbl, FIG. 7A).

If the test of step 1312 is met, then the bit line charge rate is set to a new rate in step 1314. The new rate may be faster or slower than the previous rate.

Whether or not step 1314 is performed, the process 1300 continues on to step 1124. Steps 1124-1132 are similar to process 1100 are will not be discussed further. After step 1132, process 1300 goes back to step 1306 to charge the unselected bit lines at the present rate.

Figure 14:
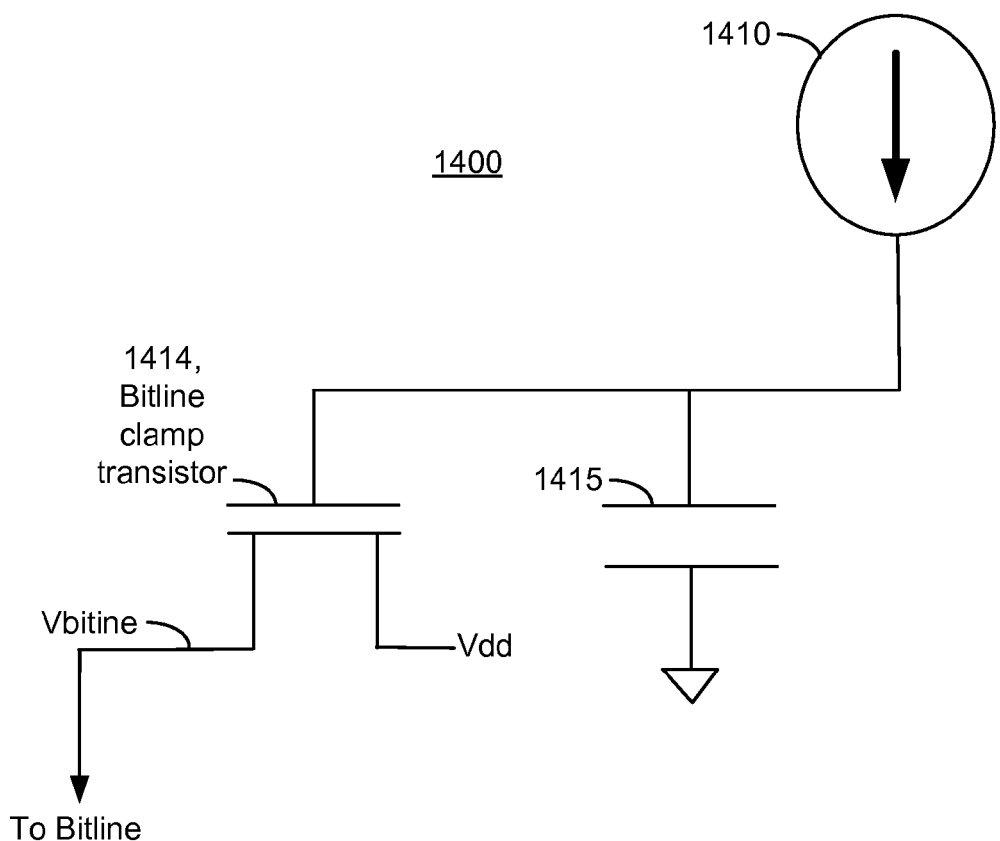
FIG. 14 is a schematic diagram of one embodiment of a circuit for charging bit lines.

FIG. 14 is a schematic diagram of one embodiment of a circuit 1400 for charging bit lines. The circuit may be used in a sense amplifier. In embodiment, circuit 1400 is used in sense circuitry 570 (FIG. 5B). The circuit 1400 has a bit line clamp transistor 1414 that is coupled to the bit line. One terminal of the bit line clamp transistor (BLC) 1414 is connected to Vdd. Note that Vdd may be an externally supplied voltage, although that is not required. By externally supplied voltage it is meant a voltage that is supplied from outside of the memory device. For example, the memory device could be a card that is used in a digital camera. The voltage can be supplied as an input on an external interface of the card. The external voltage is a power supply voltage, in one embodiment. The rate at which the BLC transistor 1414 provides Vdd to the bit line depends on its gate voltage, in one embodiment.

The circuit 1400 has a capacitor 1415 that has one node coupled to the gate of the BLC transistor 1414 and the other node coupled to ground. The circuit 1400 also has a current supply 1410, which may be variable. The current supply 1410 is coupled to the node of the capacitor 1415 that is coupled to the gate of the bit line clamp (BLC) transistor 1414. Therefore, the voltage provided to the gate of the BLC transistor 1414 may be controlled by charging capacitor 1415 using current source 1410.

Thus, to control the bit line voltage ramp up rate, the gate bias on the BLC transistor 1414 may be modulated by current source 1410. With a higher current from the current source 1410, the gate of BLC transistor 1414 bias ramps up faster, resulting in a faster ramp up of the bit line voltage. On the other hand, with a smaller current from the current source 1410, the gate of BLC transistor 1414 bias ramps up more slowly, resulting in a slower ramp up of the bit line voltage.

In one embodiment, the current source 1410 has a full magnitude of around 10 µA. A slower bit line charging rate can be achieved by reducing this current. As one example, a slower charge rate may be achieved by reducing the current to about ¾ of the full magnitude. Any percentage of the full magnitude may be used for the slower charge rate. Also, there may be any number of different charge rates.

One embodiment includes a method of operating non-volatile storage in which unselected bit lines are charged at a rate that depends on a program condition. The non-volatile storage includes a plurality of bit lines and a plurality of word lines. The method comprises: a) charging unselected bit lines of the plurality of bit lines to an inhibit voltage at a first rate, b) applying a program voltage to a selected word line of the plurality of word lines after the unselected bit lines have been charged to the inhibit voltage at the first rate; repeating said a) and b) until a program condition that indicates how far programming has progressed is reached; d) charging unselected bit lines of the plurality of bit lines to the inhibit voltage at a second rate that is different from the first rate after the program condition has been reached; and e) applying a program voltage to the selected word line after the unselected bit lines have been charged to the inhibit voltage at the second rate.

One embodiment includes a non-volatile storage device in which unselected bit lines are charged at a rate that depends on a program condition. The non-volatile storage device comprises a plurality of non-volatile storage elements, a plurality of bit lines associated with the plurality of non-volatile storage elements, a plurality of word lines associated with the plurality of non-volatile storage elements, and one or more managing circuits in communication with the plurality of bit lines and the plurality of word lines. The one or more managing circuits charge unselected bit lines of the plurality of bit lines to an inhibit voltage at a first rate. The one or more managing circuits apply a program voltage to a selected word line of the plurality of word lines after the unselected bit lines have been charged to the inhibit voltage at the first rate. The one or more managing circuits repeat the charging of unselected bit lines to the inhibit voltage at the first rate and the applying a program voltage after the unselected bit lines have been charged to the inhibit voltage at the first rate until a program condition that indicates how far programming has progressed is reached. The one or more managing circuits charge unselected bit lines of the plurality of bit lines to the inhibit voltage at a second rate that is different from the first rate after the program condition has been reached. The one or more managing circuits apply a program voltage to the selected word line after the unselected word lines have been charged to the inhibit voltage at the second rate.

One embodiment includes a method of operating non-volatile storage that comprises a plurality of non-volatile storage elements arranged as NAND strings, a plurality of bit lines, and a plurality of word lines, each of the plurality of bit lines is associated with one of the NAND strings. The method comprises: a) accessing a program loop count; b) determining a bit line charge rate based on the program loop count; c) charging unselected bit lines of the plurality of bit lines to an inhibit voltage at the bit line charge rate; d) applying a programming voltage to a selected word line of the plurality of word lines after the unselected bit lines have been charged to the inhibit voltage, the selected word line associated with a group of the plurality of non-volatile storage elements; and e) repeating said a) through said d) until programming of the group of non-volatile storage elements associated with the selected word line is complete.

One embodiment includes a non-volatile storage device in which unselected bit lines are charged at a rate that depends on a program loop count. The non-volatile storage device comprises a plurality of non-volatile storage elements arranged as NAND strings, a plurality of bit lines associated with the plurality of non-volatile storage elements, a plurality of word lines associated with the plurality of non-volatile storage elements, and one or more managing circuits in communication with the plurality of bit lines and the plurality of word lines. The one or more managing circuits access a program loop count, the one or more managing circuits determine a bit line charge rate based on the program loop count. The one or more managing circuits charge unselected bit lines of the plurality of bit lines to an inhibit voltage at the bit line charge rate. The one or more managing circuits apply a programming voltage to a selected word line of the plurality of word lines after the unselected bit lines have been charged to the inhibit voltage, the one or more managing circuits repeat the accessing, the determining, the charging, and the applying until programming of non-volatile storage elements associated with the selected word line is complete.

One embodiment includes a method of operating non-volatile storage in which unselected bit lines are charged at a rate that depends on whether non-volatile storage elements associated with a selected word line and that are targeted for programming to a first state of a plurality of programmed states have reached the first state. The non-volatile storage comprises a plurality of non-volatile storage elements arranged as NAND strings, a plurality of bit lines, and a plurality of word lines. Each of the plurality of bit lines is associated with one of the NAND strings. The method comprises: a) charging unselected bit lines of the plurality of bit lines to an inhibit voltage at a first rate; b) applying a program voltage to a selected word line of the plurality of word lines after the unselected bit lines have been charged to the inhibit voltage at the first rate; c) verifying whether non-volatile storage elements associated with the selected word line that are targeted for programming to a first state of a plurality of programmed states have reached the first state; d) repeating said a) through said c) until the number is less than a threshold number; e) charging unselected bit lines of the plurality of bit lines to the inhibit voltage at a second rate that is different from the first rate after the number is less than a threshold number; and f) applying a program voltage to the selected word line after the unselected bit lines have been charged to the inhibit voltage at the second rate.

One embodiment includes a non-volatile storage device in which unselected bit lines are charged at a rate that depends on whether non-volatile storage elements being programmed to a certain state have been programmed. The non-volatile storage device includes a plurality of non-volatile storage elements arranged as NAND strings, a plurality of bit lines associated with the plurality of non-volatile storage elements, a plurality of word lines associated with the plurality of non-volatile storage elements, and one or more managing circuits in communication with the plurality of bit lines and the plurality of word lines. The one or more managing circuits charge unselected bit lines of the plurality of bit lines to an inhibit voltage at a first rate. The one or more managing circuits apply a program voltage to a selected word line of the plurality of word lines after the unselected bit lines have been charged to the inhibit voltage at the first rate. The one or more managing circuits verify whether non-volatile storage elements associated with the selected word line that are targeted for programming to a first state of a plurality of programmed states have reached the first state. The one or more managing circuits repeat the charging the unselected bit lines to the inhibit voltage at the first rate and the applying the program voltage after the unselected bit lines have been charged to the inhibit voltage at the first rate until the number is less than a pre-determined number. The one or more managing circuits charge unselected bit lines of the plurality of bit lines to the inhibit voltage at a second rate that is different from the first rate after the number is less than a pre-determined number. The one or more managing circuits apply a program voltage to the selected word line after the unselected bit lines have been charged to the inhibit voltage at the second rate.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical application, to thereby enable others skilled in the art to best utilize the various embodiments and with various modifications as are suited to the particular use contemplated. It is intended that the scope be defined by the claims appended hereto.

What is claimed is:

1. A method of operating non-volatile storage that includes a plurality of bit lines and a plurality of word lines, the method comprising:
   a) charging unselected bit lines of the plurality of bit lines to an inhibit voltage at a first rate;
   b) applying a program voltage to a selected word line of the plurality of word lines after the unselected bit lines have been charged to the inhibit voltage at the first rate;
   c) repeating said a) and said b) until a program condition that indicates how far programming has progressed is reached;
   d) charging unselected bit lines of the plurality of bit lines to the inhibit voltage at a second rate that is different from the first rate after the program condition has been reached; and
   e) applying a program voltage to the selected word line after the unselected bit lines have been charged to the inhibit voltage at the second rate.

2. The method of claim 1, further comprising:
   determining that the program condition is reached based on the number of program loops that have been completed; and
   determining the first rate and the second rate based on the number of program loops that have been completed, the first rate is slower than the second rate.

3. The method of claim 1, further comprising:
   determining that the program condition is reached based on the number of program loops that have been completed; and
   determining the first rate and the second rate based on the number of program loops that have been completed, the first rate is faster than the second rate.

4. The method of claim 1, further comprising:
   determining that the program condition is reached when the number of non-volatile storage elements associated with the selected word line that have not yet been programmed to a certain program state is less than a threshold number; and
   determining the first rate and the second rate based on whether the program condition has been reached, the first rate is faster than the second rate.

5. The method of claim 1, further comprising:
   determining that the program condition is reached when the number of non-volatile storage elements associated with the selected word line that have not yet been programmed to a certain program state is less than a threshold number; and
   determining the first rate and the second rate based on whether the program condition has been reached, the first rate is slower than the second rate.

6. The method of claim 1, wherein each bit line of the plurality of bit lines is associated with a NAND string of non-volatile storage elements.

7. A non-volatile storage device, comprising:
a plurality of non-volatile storage elements;
a plurality of bit lines associated with the plurality of non-volatile storage elements;
a plurality of word lines associated with the plurality of non-volatile storage elements; and
one or more managing circuits in communication with the plurality of bit lines and the plurality of word lines, the one or more managing circuits charge unselected bit lines of the plurality of bit lines to an inhibit voltage at a first rate, the one or more managing circuits apply a program voltage to a selected word line of the plurality of word lines after the unselected bit lines have been charged to the inhibit voltage at the first rate, the one or more managing circuits repeat the charging of unselected bit lines to the inhibit voltage at the first rate and the applying a program voltage after the unselected bit lines have been charged to the inhibit voltage at the first rate until a program condition that indicates how far programming has progressed is reached, the one or more managing circuits charge unselected bit lines of the plurality of bit lines to the inhibit voltage at a second rate that is different from the first rate after the program condition has been reached, the one or more managing circuits apply a program voltage to the selected word line after the unselected word lines have been charged to the inhibit voltage at the second rate.

8. The non-volatile storage device of claim 7, wherein the one or more managing circuits determine that the program condition is reached based on the number of program loops that have been completed, the one or more managing circuits determine the first rate and the second rate based on the number of program loops that have been completed, the first rate is slower than the second rate.

9. The non-volatile storage device of claim 7, wherein the one or more managing circuits determine that the program condition is reached based on the number of program loops that have been completed, the one or more managing circuits determine the first rate and the second rate based on the number of program loops that have been completed, the first rate is faster than the second rate.

10. The non-volatile storage device of claim 7, wherein the one or more managing circuits determine that the program condition is reached when the number of non-volatile storage elements associated with the selected word line that have been programmed to a certain program state is greater than a pre-determined number, the one or more managing circuits determine the first rate and the second rate based on whether the program condition has occurred, the first rate is faster than the second rate.

11. The non-volatile storage device of claim 7, wherein the one or more managing circuits determine that the program condition is reached when the number of non-volatile storage elements associated with the selected word line that have been programmed to a certain program state is greater than a pre-determined number, the one or more managing circuits determine the first rate and the second rate based on whether the program condition has occurred, the first rate is slower than the second rate.

12. The non-volatile storage device of claim 7, wherein each bit line of the plurality of bit lines is associated with a NAND string of non-volatile storage elements.

13. The non-volatile storage device of claim 7, further comprising a three-dimensional memory array, wherein the plurality of non-volatile storage elements are part of said three-dimensional memory array.

14. A method of operating non-volatile storage that comprises a plurality of non-volatile storage elements arranged as NAND strings, a plurality of bit lines, and a plurality of word lines, each of the plurality of bit lines is associated with one of the NAND strings, the method comprising:
a) accessing a program loop count;
b) determining a bit line charge rate based on the program loop count;
c) charging unselected bit lines of the plurality of bit lines to an inhibit voltage at the bit line charge rate;
d) applying a programming voltage to a selected word line of the plurality of word lines after the unselected bit lines have been charged to the inhibit voltage, the selected word line associated with a group of the plurality of non-volatile storage elements; and
e) repeating said a) through said d) until programming of the group of non-volatile storage elements associated with the selected word line is complete.

15. The method of claim 14, wherein the determining a bit line charge rate based on the program loop count includes:
establishing the bit line charge rate at a first rate if the program loop count is less than or equal to a predetermined number of program loops; and
establishing the bit line charge rate at a second rate that is faster than the first rate if the program loop count is greater than the predetermined number of program loops.

16. The method of claim 14, wherein the determining a bit line charge rate based on the program loop count includes:
establishing the bit line charge rate at a first rate if the program loop count is less than or equal to a predetermined number of program loops; and
establishing the bit line charge rate at a second rate that is slower than the first rate if the program loop count is greater than the predetermined number of program loops.

17. The method of claim 14, wherein the applying a programming voltage to a selected word line after the unselected bit lines have been charged to the inhibit voltage includes waiting a period of time after beginning to charge the unselected bit lines prior to applying the programming voltage, the period of time depends on the program loop count.

18. The method of claim 14, further comprising:
establishing a voltage on selected bit lines of the plurality of bit lines that allows programming prior to the applying a programming voltage to a selected word, the selected bit lines include bit lines associated with non-volatile storage elements being programmed to all states of a plurality of states.

19. The method of claim 14, wherein the charging unselected bit lines to an inhibit voltage at the bit line charge rate includes:
controlling the rate at which a power supply voltage is allowed to pass to the unselected bit lines.

20. A non-volatile storage device, comprising:
a plurality of non-volatile storage elements arranged as NAND strings;
a plurality of bit lines associated with the plurality of non-volatile storage elements;
a plurality of word lines associated with the plurality of non-volatile storage elements; and
one or more managing circuits in communication with the plurality of bit lines and the plurality of word lines, the one or more managing circuits access a program loop count, the one or more managing circuits determine a bit line charge rate based on the program loop count, the one or more managing circuits charge unselected bit lines of the plurality of bit lines to an inhibit voltage at the bit line charge rate, the one or more managing circuits apply a programming voltage to a selected word line of the plurality of word lines after the unselected bit lines have been charged to the inhibit voltage, the one or more managing circuits repeat the accessing, the determining, the charging, and the applying until programing of non-volatile storage elements associated with the selected word line is complete.

21. The non-volatile storage device of claim 20, wherein, when determining a bit line charge rate based on the program loop count, the one or more managing circuits establish the bit line charge rate at a first rate if the program loop count is less than or equal to a predetermined number of program loops and establish the bit line charge rate at a second rate that is faster than the first rate if the program loop count is less greater than the predetermined number of program loops.

22. The non-volatile storage device of claim 20, wherein, when determining a bit line charge rate based on the program loop count, the one or more managing circuits establish the bit line charge rate at a first rate if the program loop count is less than or equal to a predetermined number of program loops and establish the bit line charge rate at a second rate that is slower than the first rate if the program loop count is less greater than the predetermined number of program loops.

23. The non-volatile storage device of claim 20, wherein the one or more managing circuits establish selected bit lines of the plurality of bit lines at a voltage that allows programming prior to applying the programming voltage to the selected word, the selected bit lines include bit lines associated with non-volatile storage elements being programmed to all states of a plurality of states.

24. The non-volatile storage device of claim 20, wherein the unselected bit lines include both even and odd bit lines of the plurality of bit lines.

25. The non-volatile storage device of claim 20, further comprising:
a plurality of sense amplifiers, each of the sense amplifiers is associated with one of the plurality of bit lines, each of the sense amplifiers has a transistor that provides a voltage to its associated bit line, the one or more managing circuits provide the inhibit voltage to a first terminal of the transistor and control a signal to a gate of the transistor in order to charge the unselected bit lines to the inhibit voltage at the bit line charge rate.

26. The non-volatile storage device of claim 20, further comprising a three-dimensional memory array, wherein the plurality of non-volatile storage elements arranged as NAND strings are part of said three-dimensional memory array.

27. A method of operating non-volatile storage that comprises a plurality of non-volatile storage elements arranged as NAND strings, a plurality of bit lines, and a plurality of word lines, each of the plurality of bit lines is associated with one of the NAND strings, the method comprising:
a) charging unselected bit lines of the plurality of bit lines to an inhibit voltage at a first rate;
b) applying a program voltage to a selected word line of the plurality of word lines after the unselected bit lines have been charged to the inhibit voltage at the first rate;
c) verifying whether non-volatile storage elements associated with the selected word line that are targeted for programming to a first state of a plurality of programmed states have reached the first state;
d) repeating said a) through said c) until the number is less than a threshold number;
e) charging unselected bit lines of the plurality of bit lines to the inhibit voltage at a second rate that is different from the first rate after the number is less than a threshold number; and
f) applying a program voltage to the selected word line after the unselected bit lines have been charged to the inhibit voltage at the second rate.

28. The method of claim 27, wherein the first rate is slower than the second rate.

29. The method of claim 27, wherein the first rate is faster than the second rate.

30. A non-volatile storage device, comprising:
a plurality of non-volatile storage elements arranged as NAND strings;
a plurality of bit lines associated with the plurality of non-volatile storage elements;
a plurality of word lines associated with the plurality of non-volatile storage elements; and
one or more managing circuits in communication with the plurality of bit lines and the plurality of word lines, the one or more managing circuits charge unselected bit lines of the plurality of bit lines to an inhibit voltage at a first rate, the one or more managing circuits apply a program voltage to a selected word line of the plurality of word lines after the unselected bit lines have been charged to the inhibit voltage at the first rate, the one or more managing circuits determine whether non-volatile storage elements associated with the selected word line that are targeted for programming to a first state of a plurality of programmed states have reached the first state, the one or more managing circuits repeat the charging the unselected bit lines to the inhibit voltage at the first rate and the applying the program voltage after the unselected bit lines have been charged to the inhibit voltage at the first rate until the number is less than a pre-determined number, the one or more managing circuits charge unselected bit lines of the plurality of bit lines to the inhibit voltage at a second rate that is different from the first rate after the number is less than a pre-determined number, the one or more managing circuits apply a program voltage to the selected word line after the unselected bit lines have been charged to the inhibit voltage at the second rate.

31. The non-volatile storage device of claim 30, wherein the first rate is slower than the second rate.

32. The non-volatile storage device of claim 30, further comprising a three-dimensional memory array, wherein the plurality of non-volatile storage elements arranged as NAND strings are part of said three-dimensional memory array.

* * * * *